United States Patent
Nagashima et al.

(10) Patent No.: US 9,059,035 B2
(45) Date of Patent: Jun. 16, 2015

(54) NONVOLATILE SEMICONDUCTOR DEVICE AND ITS MANUFACTURING METHOD HAVING MEMORY CELLS WITH MULTIPLE LAYERS

(75) Inventors: Satoshi Nagashima, Mie-ken (JP); Fumitaka Arai, Mie-ken (JP); Hisataka Meguro, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 108 days.

(21) Appl. No.: 13/606,757

(22) Filed: Sep. 7, 2012

(65) Prior Publication Data
US 2013/0248968 A1 Sep. 26, 2013

(30) Foreign Application Priority Data

Mar. 26, 2012 (JP) ................................ P2012-069059

(51) Int. Cl.
| | |
|---|---|
| *H01L 29/788* | (2006.01) |
| *H01L 27/115* | (2006.01) |
| *H01L 21/28* | (2006.01) |
| *H01L 29/66* | (2006.01) |
| *H01L 29/423* | (2006.01) |
| *G11C 16/04* | (2006.01) |

(52) U.S. Cl.
CPC .... *H01L 27/11551* (2013.01); *H01L 21/28273* (2013.01); *H01L 29/66825* (2013.01); *H01L 29/7881* (2013.01); *H01L 27/11524* (2013.01); *H01L 29/42324* (2013.01); *G11C 16/0408* (2013.01)

(58) Field of Classification Search
None
See application file for complete search history.

(56) References Cited

U.S. PATENT DOCUMENTS

| 8,624,317 | B2 * | 1/2014 | Arai et al. .................... 257/324 |
|---|---|---|---|
| 2003/0067326 | A1 | 4/2003 | Suzuki |
| 2003/0209753 | A1 | 11/2003 | Kamiya |
| 2004/0164340 | A1 | 8/2004 | Arai |
| 2004/0178471 | A1 | 9/2004 | Terashima |
| 2005/0105336 | A1 | 5/2005 | Sato |
| 2006/0013711 | A1 | 1/2006 | Kakiuchi |
| 2008/0023747 | A1 * | 1/2008 | Park et al. .................... 257/314 |
| 2008/0087932 | A1 * | 4/2008 | Son et al. ...................... 257/315 |

FOREIGN PATENT DOCUMENTS

| JP | 2003049615 | 2/2003 |
|---|---|---|
| JP | 20030194396 | 7/2003 |
| JP | 20030207566 | 7/2003 |
| JP | 2004-319948 A | 11/2004 |
| JP | 2005-100501 A | 4/2005 |
| JP | 20050348371 | 12/2005 |
| JP | 2007027776 | 2/2007 |
| JP | 2011040918 | 2/2011 |

* cited by examiner

*Primary Examiner* — Davienne Monbleau
*Assistant Examiner* — Shaka White
(74) *Attorney, Agent, or Firm* — Patterson & Sheridan, LLP

(57) ABSTRACT

A nonvolatile semiconductor memory device a first memory cell array layer, a first insulation layer formed on top of the first memory cell array layer, a second memory cell array layer formed on the first insulation layer, and a control gate. The first and second memory cell array layers have first and second NAND cell units provided with multiple first and second memory cells connected in series in a first direction and the first and second selection gates connected at both ends of the multiple first and second memory cells. The control gate is formed via an insulation layer between gates of the memory cells on both sides thereof in the first direction, and extends in the second direction perpendicular to the first direction.

15 Claims, 48 Drawing Sheets

GC DIRECTION

GC DIRECTION
←——→

GC DIRECTION
←——→

GC DIRECTION

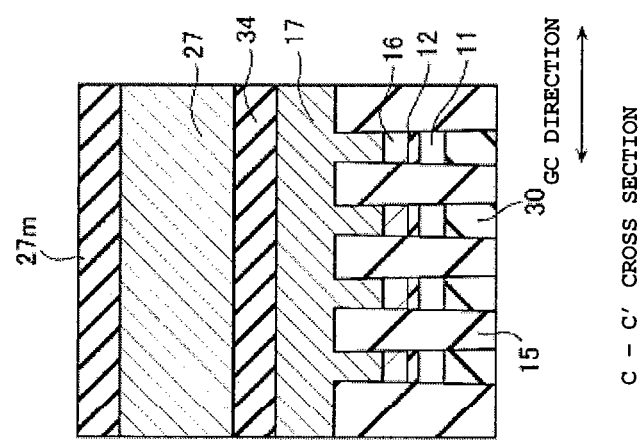

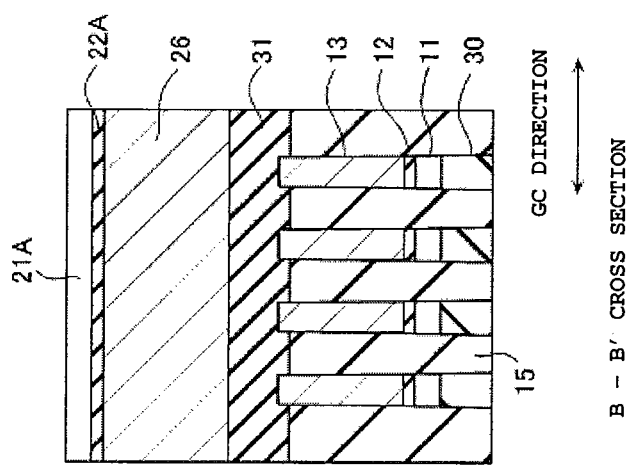

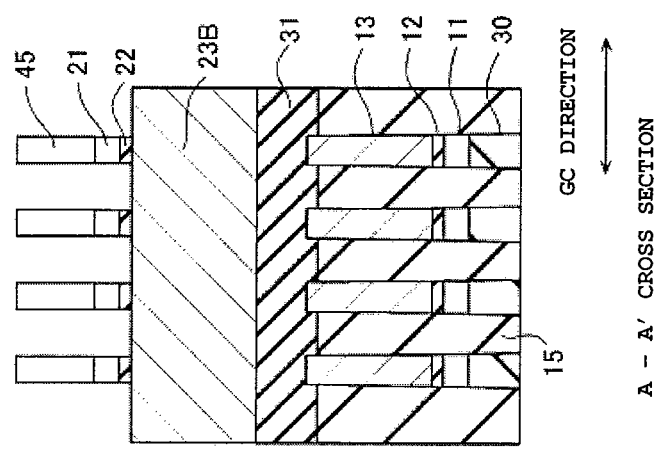

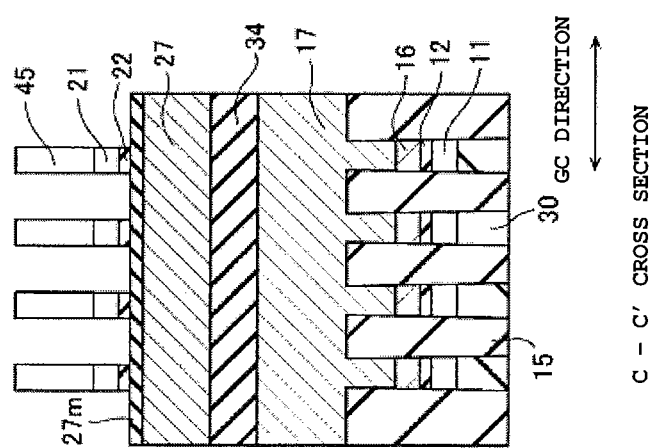

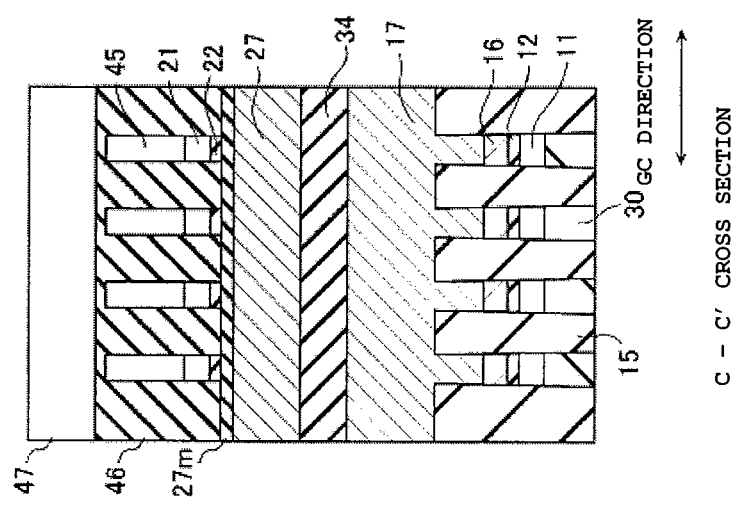

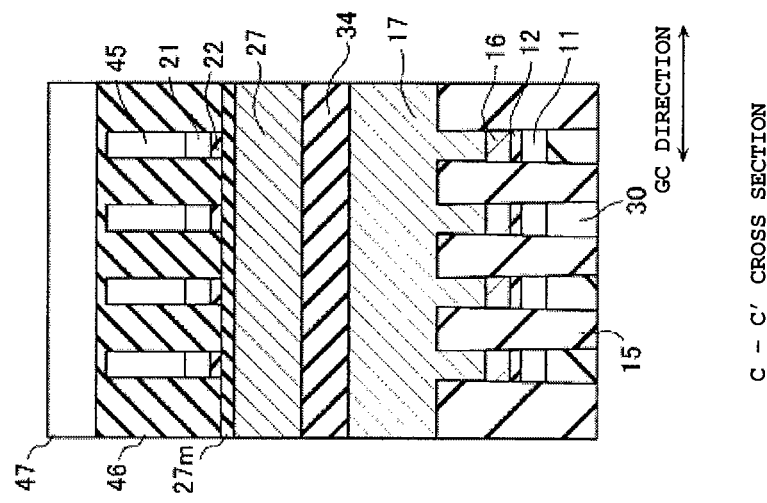

US 9,059,035 B2

NONVOLATILE SEMICONDUCTOR DEVICE AND ITS MANUFACTURING METHOD HAVING MEMORY CELLS WITH MULTIPLE LAYERS

CROSS-REFERENCE TO RELATED APPLICATION

This application is based upon and claims the benefit of priority from Japanese Patent Application No. 2012-069059, filed Mar. 26, 2012; the entire contents of which are incorporated herein by reference.

FIELD

Embodiments described herein relate to a nonvolatile semiconductor memory device and its manufacturing method.

BACKGROUND

NAND type flash memory has been recognize as a nonvolatile semiconductor memory device that can be rewritten and can be highly integrated. A memory transistor of a conventional NAND type flash memory has a stack gate structure formed by laminating an electric-charge accumulation layer (known as the floating gate) and a control gate with an insulation film disposed in between. In recent years, a NAND type flash memory structure for reliably maintaining the coupling ratio has been proposed where the potential of a write-in target memory cell is raised by placing a control gate electrode between adjacent floating gates along the word line direction, in place of the stack gate structure. Such structures have been proposed for reliably maintaining the coupling ratio without increasing the difficulty in processing by too much.

DESCRIPTION OF THE DRAWINGS

FIGS. 16A to 16C are cross-sectional diagrams showing the memory cell array structure of FIG. 1 during manufacturing.

FIGS. 18A to 18C are cross-sectional diagrams showing the memory cell array structure of FIG. 1 during manufacturing.

FIGS. 20A to 20C are cross-sectional diagrams showing the memory cell array structure of FIG. 1 during manufacturing.

FIGS. 22A to 22C are cross-sectional diagrams showing the memory cell array structure of FIG. 1 during manufacturing.

FIGS. 25A to 25C are cross-sectional diagrams showing the memory cell array structure of FIG. 1 during manufacturing.

DETAILED DESCRIPTION

In general, embodiments will be described with reference to the attached diagrams.

According to one embodiment, there is provided a nonvolatile semiconductor memory device that is easy to manufacture and its manufacturing method.

A nonvolatile semiconductor memory device according to an embodiment includes a first memory cell array layer, a first insulation layer formed on top of the first memory cell array layer, a second memory cell array layer formed on top of the first insulation layer, and a control gate. The first memory cell array layer has a first NAND cell unit provided with multiple first memory cells connected in series along a first direction and a first selection gate connected at both ends of the multiple first memory cells. The first memory cells and the first selection gate include a first semiconductor layer, a first gate insulation film formed on top of the first semiconductor layer, and a first gate layer formed on top of the first gate insulation film. The second memory cell array layer is formed on top of the first insulation layer, and has a second NAND cell unit provided with multiple second memory cells connected in series along the first direction and a second selection gate connected at both ends of the multiple second memory cells. The second memory cells and the second selection gate include a second gate layer, a second gate insulation film formed on top of the second gate layer, and a second semiconductor layer formed on top of the second gate insulation film. The control gate is formed via an insulation film on both sides of the first and second gate layers along the first direction, and extends in a second direction perpendicular to the first direction. Furthermore, the second gate layer of the second selection gate of the second NAND cell unit adjacent to the second direction is formed as one body.

Embodiment 1

Structure of the Memory Cell Array

Figure 1:
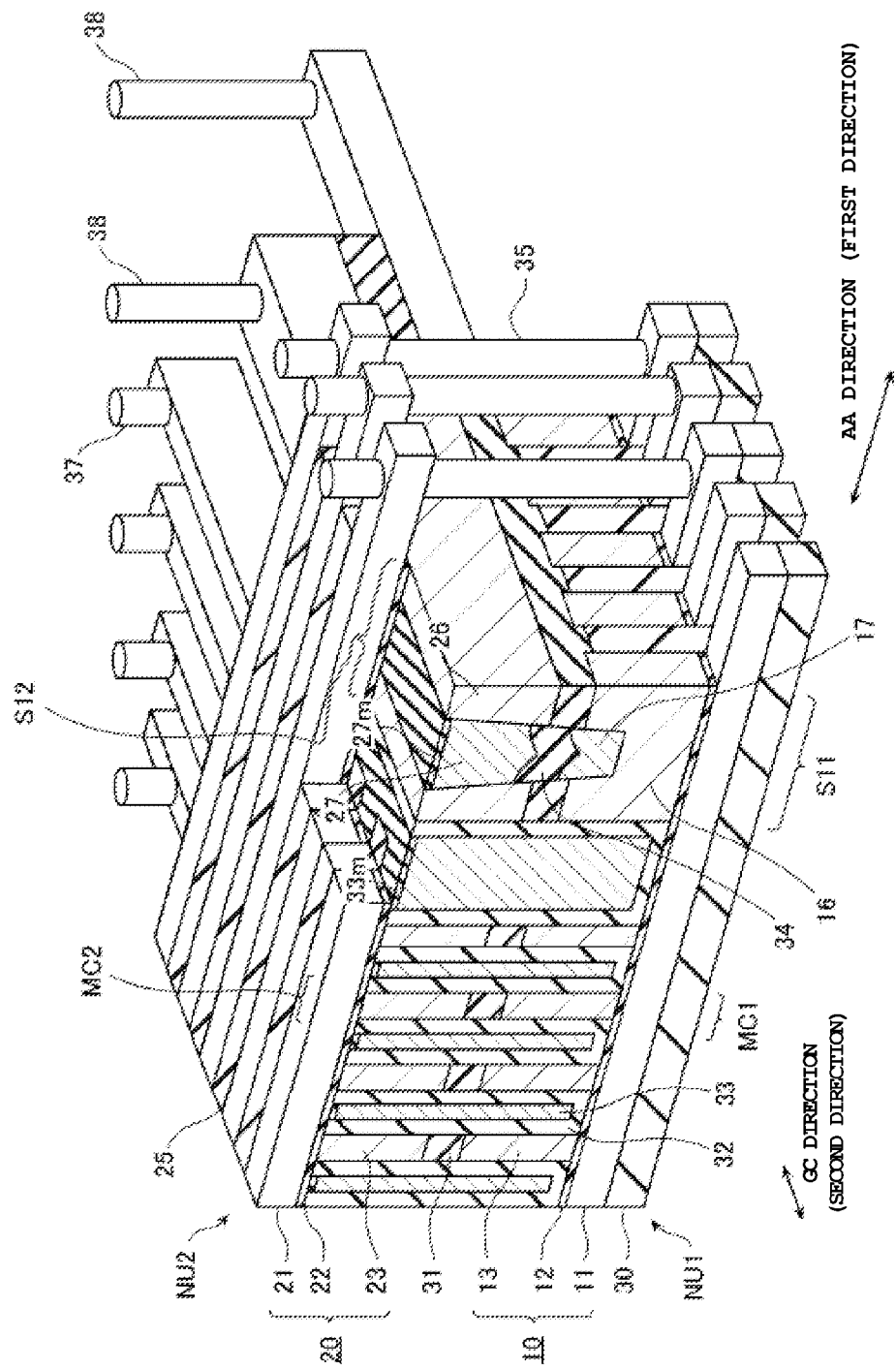
FIG. 1 is a perspective diagram showing a memory cell array structure of the nonvolatile semiconductor memory device according to a first embodiment.
Figure 2:
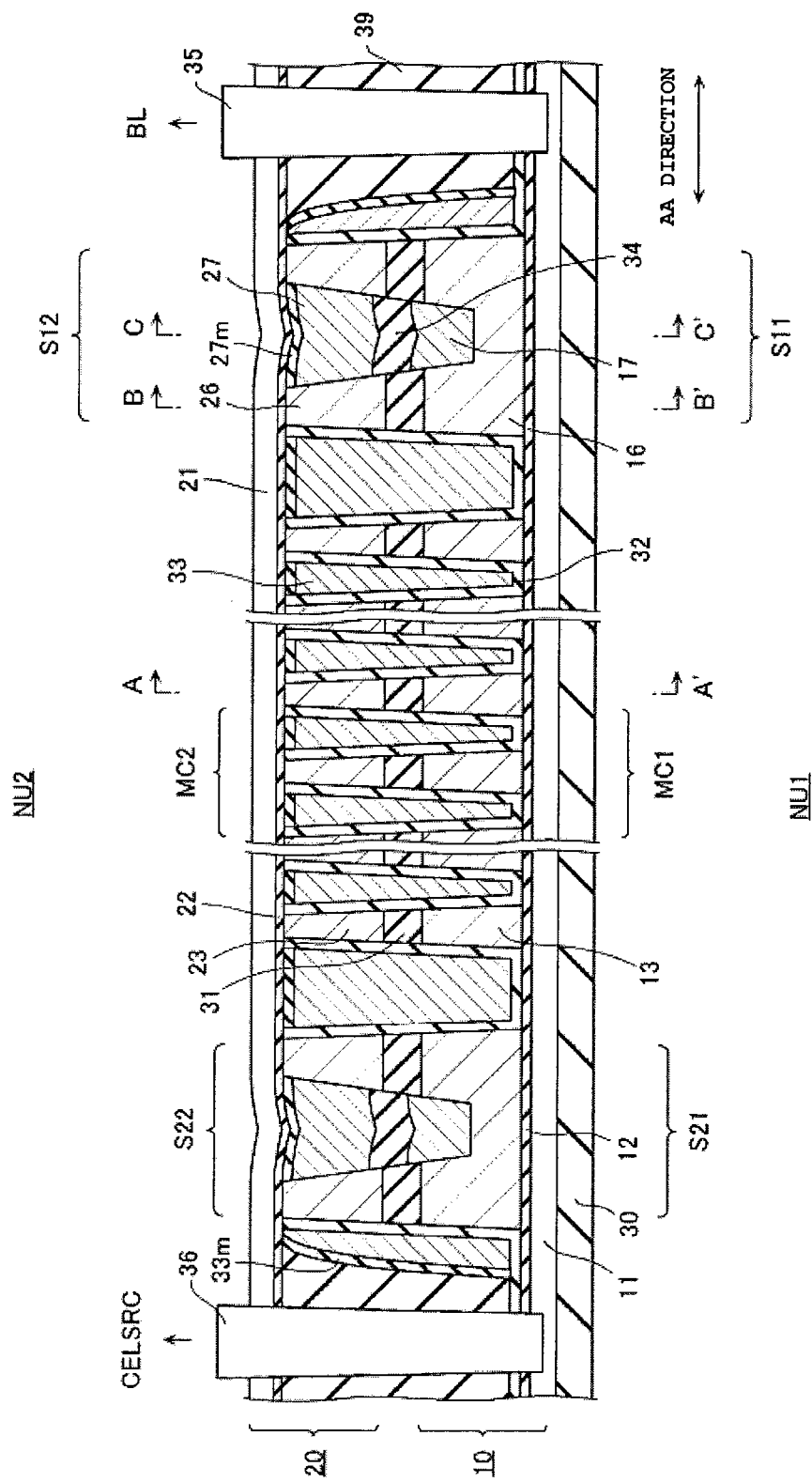
FIG. 2 is a cross-sectional diagram showing the structure of the memory cell array structure of FIG. 1 in the GC direction.
Figure 3A:
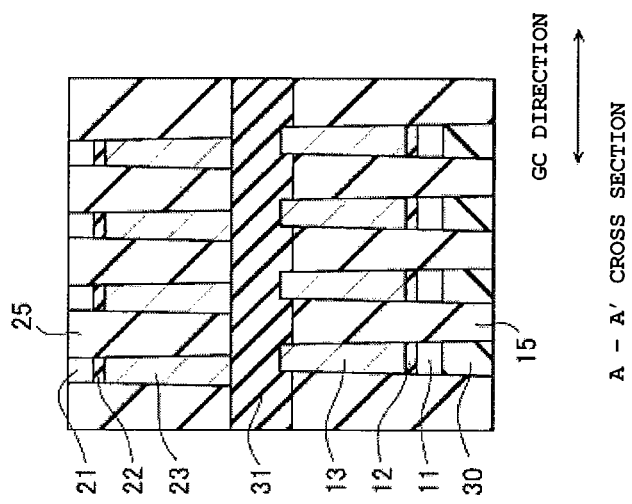
FIGS. 3A to 3C are cross-sections taken along lines A-A', B-B' and C-C', respectively, in FIG. 2.
Figure 3B:
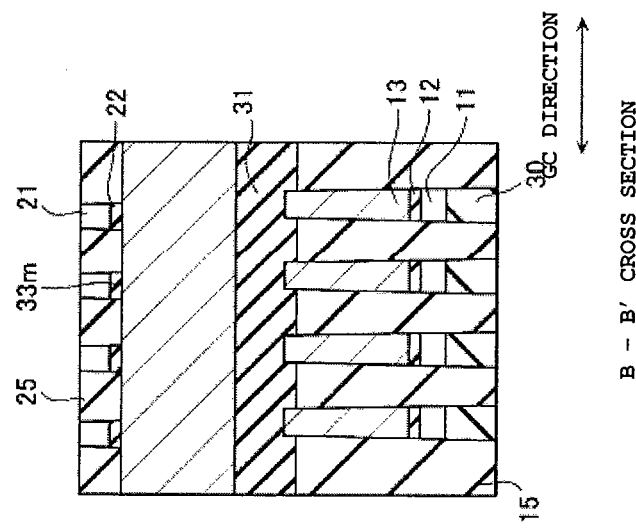
Figure 3C:
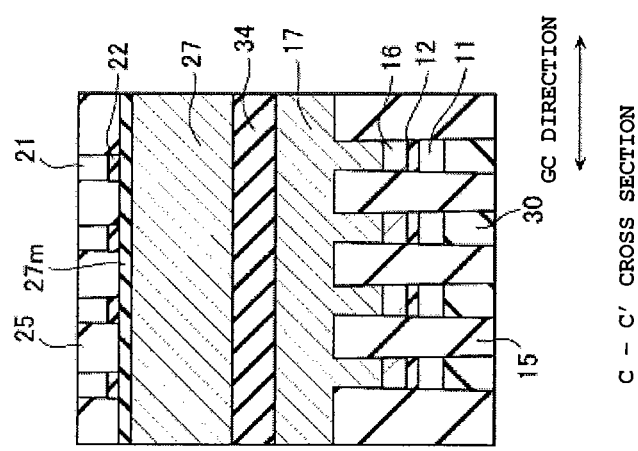

FIG. 1 is a perspective view of a right-half portion of a memory cell array structure according to a first embodiment. FIG. 2 is a cross-section of the memory cell array structure according to the first embodiment and viewed from the GC (gate) direction. FIGS. 3A to 3C are cross-sections taken along lines A-A', B-B' and C-C', respectively, in FIG. 2, and viewed from the AA (active area) direction.

This memory cell array structure reliably maintains the coupling ratio by raising the potential of the cell, for example, when writing, by providing control gate electrodes on both sides of the floating gates (charge accumulation layers) via an inter-gate insulation film. In addition, each of the control gate electrodes is shared by memory cells that are arranged vertically.

In the present specification and the claims, the direction toward a base 30 shown in FIG. 1 is to be understood as the down direction, and its opposite direction the up direction.

As shown in FIG. 1, on top of the base 30 of an insulation body, a first semiconductor layer 11 and a second semiconductor layer 21 are arranged vertically as bodies that forma channel. Between them, a first floating gate 13 on a top side of the first semiconductor layer 11 via a first gate insulation layer 12 and a second floating gate 23 on a bottom side of the second semiconductor layer 21 via a second gate insulation layer 22 are laminated vertically on either side of a first insulation layer 31. The semiconductor layers 11, 21, the gate insulation layers 12, 22, and the floating gates 13, 23, also shown in the A-A' cross section of FIG. 3A, are insulated and separated in the GC direction (the second direction) via interlayer insulation layers 15, 25 that extend in the AA direction (the first direction).

The laminated structure of the floating gates 13, 23 is subjected to multiple formations at a specified interval in the AA direction along the semiconductor layers 11, 21. On both sides of the floating gates 13, 23 in the AA direction, a control gate 33 is formed along the GC direction via an inter-gate insulation layer (e.g., IPD: inter poly insulation layer) 32. The control gate 33 is provided on the floating gates 13, 23 in common so that there is coupling from the sides on the floating gates 13, 23. Between the control gate 33 and the second gate insulation layer 22, a mask material 33 is provided. The bottom side of the first semiconductor layer 11, the first gate insulation layer 12, the first floating gate 13, the inter-gate insulation layer 32 and the control gate 33 make up a first memory cell MC1 at the bottom side. Furthermore, the top side of the second semiconductor layer 21, the second gate insulation layer 22, the second floating gate 23, the inter-gate insulation layer 32 and the control gate 33 make up a second memory cell MC2 at the top side.

At a position adjacent to the control gate 33 through the inter-gate insulation layer 32 and at both ends in the arrangement direction of the laminated structure of the floating gates 13, 23, the first selection gate 16 and the second selection gate 26 of selection gate transistors S11, S12, S21, S22 are provided. The selection gates 16 and 26 are laminated vertically on either side of the first insulation layer 31, and face the semiconductor layers 11, 21 via the respective gate insulation layers 12, 22. In the first selection gate 16, a first selection gate line 17 that extends along the GC direction is filled; in the second selection gate 26, a second selection gate line 27 and a mask material 27m that extend along the GC direction are filled. The selection gate lines 17, 27 are insulated and separated via the second insulation layer 34. If the first floating gate 13 and the first selection gate 16 are referred to as the first gate layer, and the second floating gate 23 and the second selection gate 26 are referred to as the second gate layer, the second selection gate 26 of the second selection gate transistors S12, S22 and the plane on the side of the first insulation layer 31 of the second selection gate line 27 will be formed continuously in the GC direction.

At the bottom side of a first NAND cell unit NU1, a first memory cell MC1 and the selection gate transistors S11, S21 connected to the bottom side of the NAND cell unit are included. A first memory cell array layer 10 includes multiple first NAND cell units NU1 arranged in the GC direction via the first element separation insulation layer 15. Furthermore, at the top side of a second NAND cell unit NU2, a second memory cell MC2 and the selection gate transistors S12, S22 connected to the top side of the NAND cell unit are included. A second memory cell array layer 20 includes multiple second NAND cell units NU2 arranged in the GC direction. The memory cell array section of the second NAND cell unit is insulated and separated in the GC direction by the second element separation insulation layer 25. The second selection gate 26 constituting the end section of the second NAND cell unit is formed as one body between the multiple second NAND cell units arranged in the GC direction. The control gate 33 between the selection gate transistor S11 and the memory cell MC adjacent to the selection gate transistor S11 has a top section formed in a comb shape and a second element separation insulation film 25 is filled therein.

On the semiconductor layers 11, 21 at one end of the NAND cell units NU1, NU2, a bit line contact 35 linked to the bit line BL, not shown in the diagram, that extends vertically is formed in common to the NAND cell units NU1, NU2. Furthermore, on the semiconductor layers 11, 21 at the other end of the NAND cell units NU1, NU2, a source line contact 36 linked to the source line, not shown in the diagram, that extends vertically is formed in common to the NAND cell units NU1, NU2. Moreover, a word line contact 37 is formed at the end section of the control gate 33. At the end sections of the selection gate lines 17, 27, selection gate line contacts 38 each provided for one of the selection gate lines 17, 27 are connected.

Figure 4:
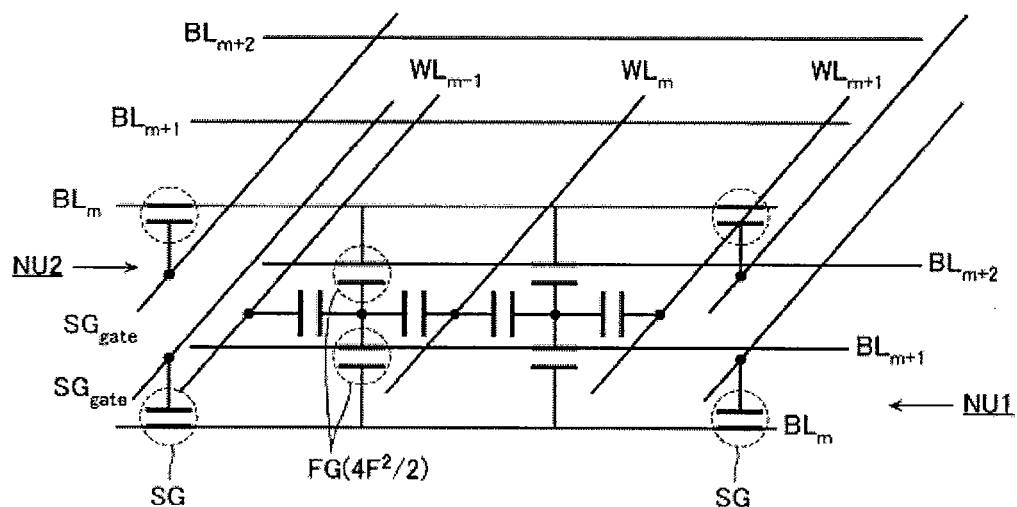
FIG. 4 is an equivalent circuit diagram of the memory cell array structure of FIG. 1.

According to the above configuration, as shown in an equivalent circuit diagram in FIG. 4, the floating gates 13, 23 of the memory cells MC1, MC2 corresponding to the NAND cell units NU1, NU2 are driven at the same time by coupling with the word line WL at both sides, and are connected to a common bit line BL. The selection gate transistors S11 to S22 are each provided independently with respect to the bit lines BL. The NAND cell units NU1, NU2 can be selectively activated.

(Method for the Manufacture of the Memory Cell Array)

Next, an explanation will be given to the method for the manufacture of the memory cell array according to an embodiment.

First, for the formation of a peripheral circuit region, several variations can be considered. However, in the case of preparing on bulk silicon substrate, it is necessary to form the peripheral circuit first. It is also acceptable that the memory cell array according to the embodiment is formed at the same time as the peripheral circuit on the bulk silicon substrate. According to the embodiment, since the NAND cell unit NU1 above the peripheral circuit region and NAND cell unit NU2 above the NAND cell unit NU1 are provided, the example for the formation of the NAND cell units NU1, NU2 on top of the silicon substrate will be explained.

The method for the formation of the peripheral circuit transistor is the same as the conventional method. First, on top of the silicon substrate, a channel is formed, and gate oxide films (both a low voltage oxide film and a high voltage oxide film) are formed. After the lamination of the gate electrode and the AA (active area) processing mask material, STI (shallow trench isolation) grooves are formed. Next, after filling of the STI grooves, the GC (gate) processing mask material is laminated. After processing the GC electrode and the formation of the sidewall insulation film, the source drain diffusion layer is formed, the insulation film between GC electrode is formed, and flattening is carried out.

After the formation of the peripheral circuit, the memory cell array of the present embodiment is prepared on top of this layer. FIG. 5 to FIG. 27C are the diagrams showing the methods for the formation of the memory cell array according to the embodiment.

Figure 5:
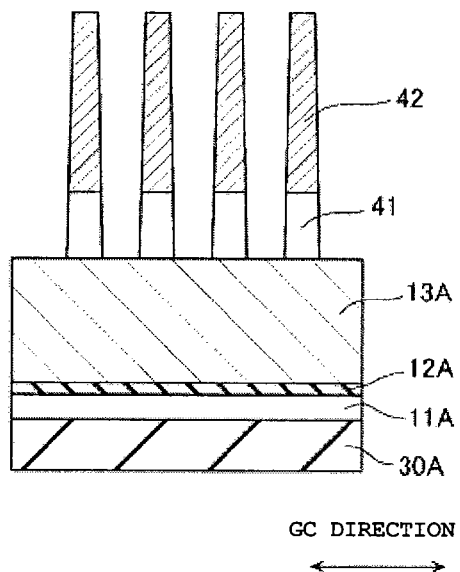
FIG. 5 is a cross-sectional diagram showing the memory cell array structure of FIG. 1 during manufacturing.

First of all, as shown in FIG. 5, the insulation layer 30A (e.g., $SiO_2$) is formed on top of the silicon substrate not shown in the diagram. On top of this, a first semiconductor layer-11A of polysilicon, a first gate insulation layer 12A of $SiO_2$, and a first gate formation layer 13A of polysilicon are laminated in sequence to form the first gate layer. Furthermore, mask materials 41, 42, for example, SiN, $SiO_2$, for AA pattern processing are subjected to pattern formation. The first semiconductor layer 11A is formed as the channel (the body) using basic polysilicon, but it is also acceptable to use a single crystal silicon. In the embodiment, polysilicon is used in the channel (the body). By having the SOI (silicon on insulator) structure, there is no need to form the STI on the silicon substrate, and a cell structure with a further improvement in lamination can be obtained. Because of the formation of the gate insulation layer 12A on top of the semiconductor layer 11A by using polysilicon, rather than a hot oxide film, CVD (Chemical Vapor Deposition) or ALD (atomic layer deposition) oxide film may be used. The first semiconductor layer 11A is formed by film formation in the manner described above.

Figure 6:
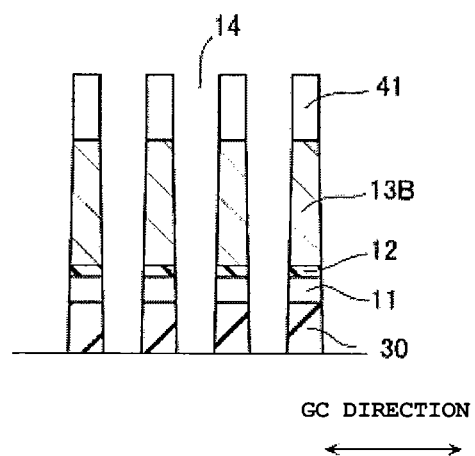
FIG. 6 is a cross-sectional diagram showing the memory cell array structure of FIG. 1 during manufacturing.

Next, by RIE (Reactive Ion Etching) while using the mask materials 41, 42 as shown in FIG. 6, a laminated body is selectively etched to the bottom of the insulation layer 30A to provide first grooves 14 and for processing the AA pattern. In doing so, the first gate formation layer 13B, the first gate insulation layer 12, the first semiconductor layer 11 and the insulation layer 30 are formed.

Figure 7:
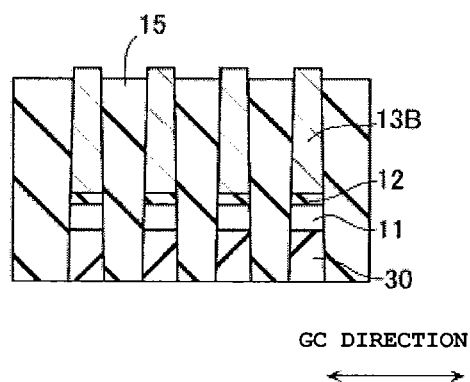
FIG. 7 is a cross-sectional diagram showing the memory cell array structure of FIG. 1 during manufacturing.
Figure 8:
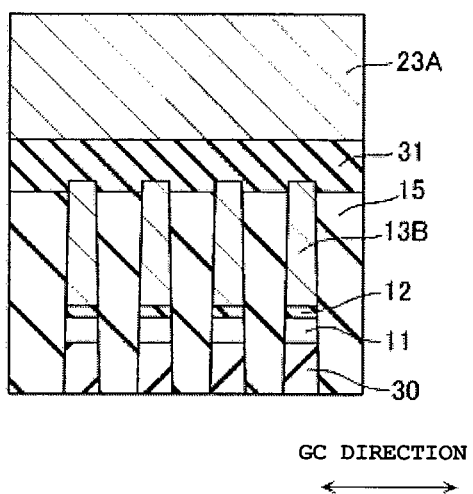
FIG. 8 is a cross-sectional diagram showing the memory cell array structure of FIG. 1 during manufacturing.

Next, as shown in FIG. 7, in the groove 14 formed by the AA pattern processing, the first element separation insulation 15 of $SiO_2$ is filled. Flattening is carried out by CMP (Chemical Mechanical Polishing) with the polysilicon as the stopper for the formation of the first gate formation layer 13B. Furthermore, by etching, the top side of the first element separation insulation layer 15 is recessed. Next, as shown in FIG. 8, the first insulation layer 31 is formed on top of the first element separation insulation 15 and the first gate formation layer 13B. On top of the first insulation layer 31, the second gate formation layer 23A of polysilicon is formed as the second gate layer.

Figure 9:
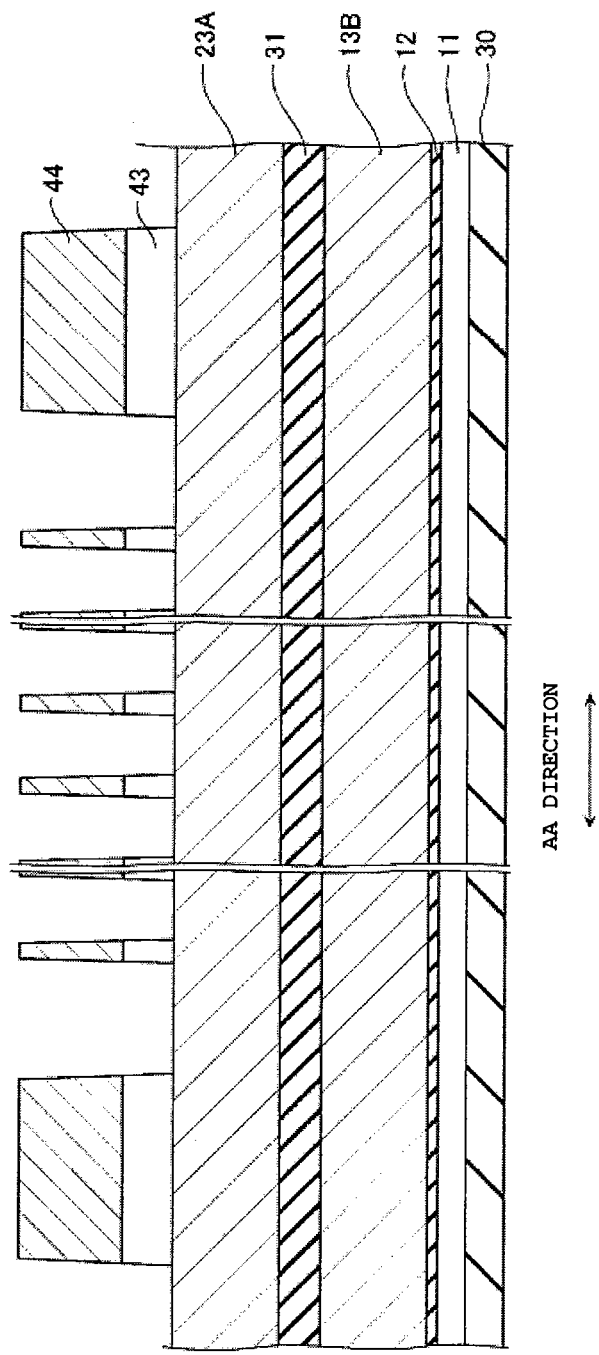
FIG. 9 is a cross-sectional diagram showing the memory cell array structure of FIG. 1 during manufacturing.
Figure 10:
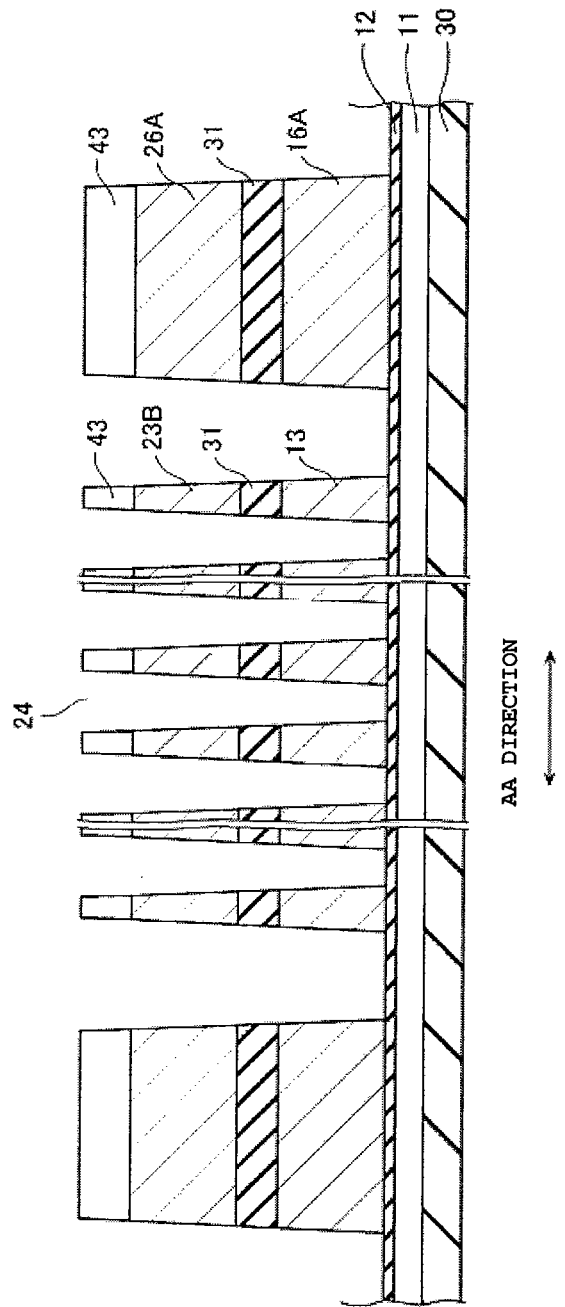
FIG. 10 is a cross-sectional diagram showing the memory cell array structure of FIG. 1 during manufacturing.

As shown in FIG. 9, on top of the second gate formation layer 23A, mask materials 43, 44 (for example, SiN, $SiO_2$) for GC pattern processing are subjected to pattern formation. As shown in FIG. 10, using the RIE method and the mask materials 43, 44, the laminated body is selectively etched up to the top of the gate insulation layer 12 to form the second grooves 24 for the formation of the GC pattern. In doing so, the first floating gate 13, the second gate formation layer 23B, the first selection gate formation layer 16A and the second selection gate formation layer 26A are formed. This GC pattern processing is carried out with the etching having a high selection ratio favoring the gate insulation layer 12 of the lower layer. It is desirable that the semiconductor layer 11 of the lower layer is not etched.

Figure 11:
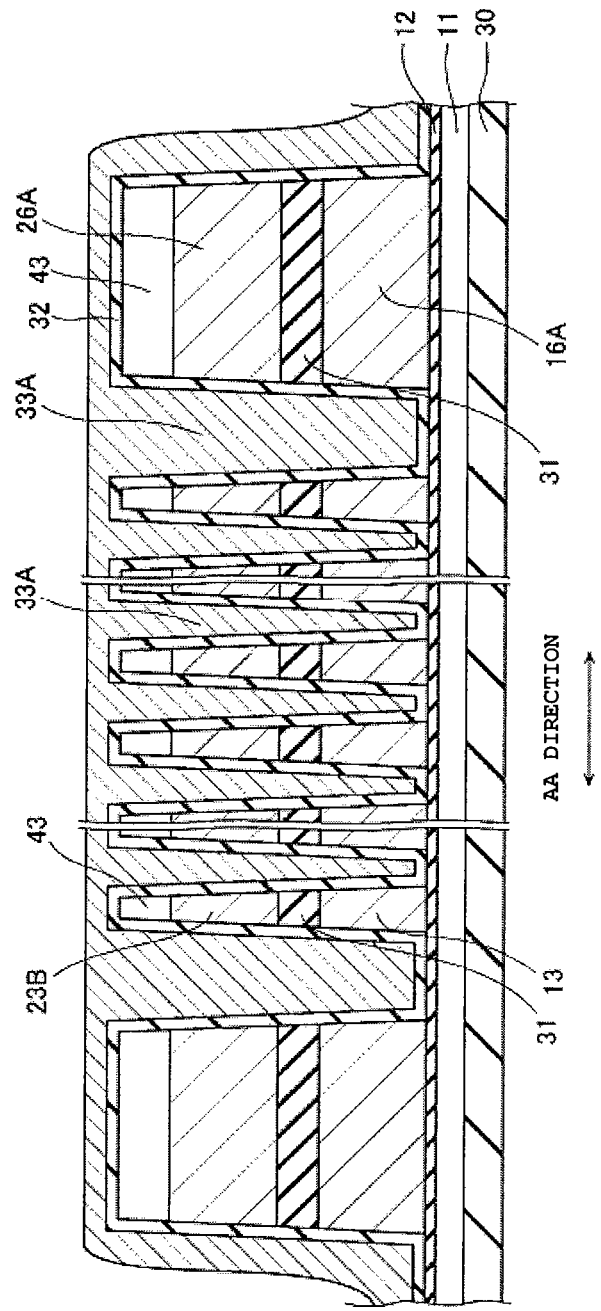
FIG. 11 is a cross-sectional diagram showing the memory cell array structure of FIG. 1 during manufacturing.

As shown in FIG. 11, after the film formation of the inter-gate insulation layer (IPD) 32 using $SiC_2$, the control gate formation layer 33A is buried in between the GC patterns. As the control gate formation layer 33A, polysilicon or a metal (W or the like) can be used.

Figure 12:
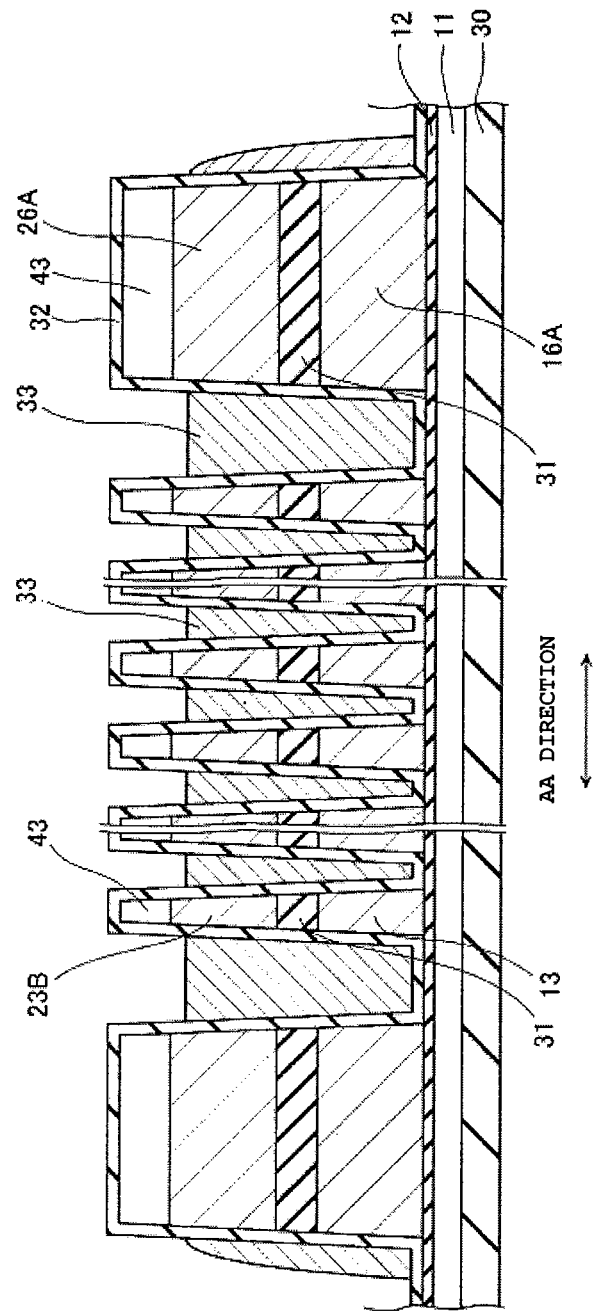
FIG. 12 is a cross-sectional diagram showing the memory cell array structure of FIG. 1 during manufacturing.
Figure 13:
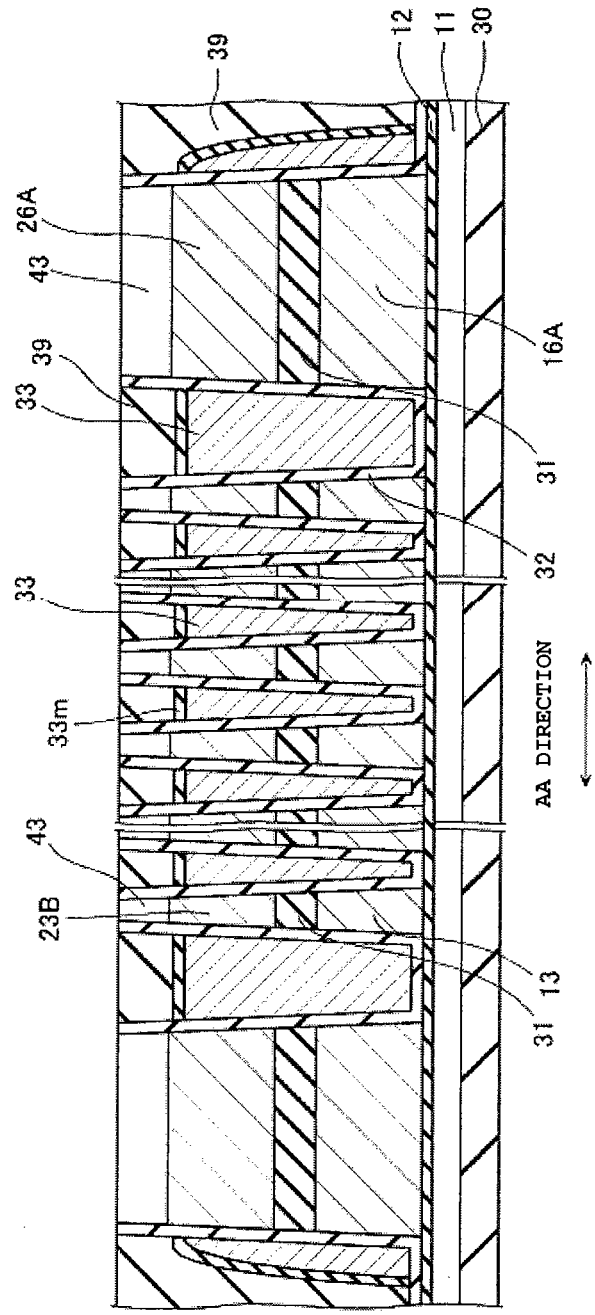
FIG. 13 is a cross-sectional diagram showing the memory cell array structure of FIG. 1 during manufacturing.
Figure 14:
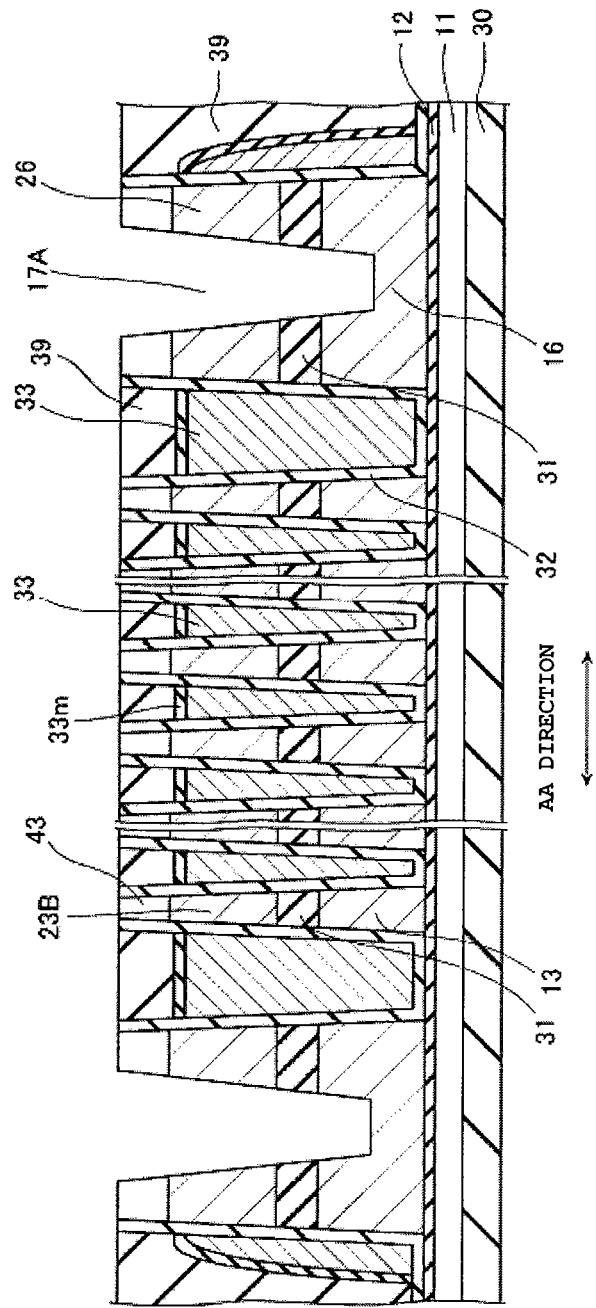
FIG. 14 is a cross-sectional diagram showing the memory cell array structure of FIG. 1 during manufacturing.

Next, as shown in FIG. 12, etch-back using RIE is carried out with respect to the control gate formation layer 33A to form the control gate 33. On top of the structure shown in FIG. 12, as shown in FIG. 13, the mask material 33m and the inter-element insulation film 39 made of CVD oxide film, a coated oxide film, or the like, are filled in. Using the mask 43 and SiN as the stopper, the top is flattened by CMP. Afterward, in order to form the selection gate formation layers 16A, 26A (or a transistor having a low decoder section that is not shown in the diagram), a selection gate groove processing equivalent to the EI (Etching Inter Poly) processing is carried out with RIE or the like. As shown in FIG. 14, the third groove 17A reaching the second selection gate 26, the first insulation layer 31 and the first selection gate 16 is formed thereby.

Figure 15:
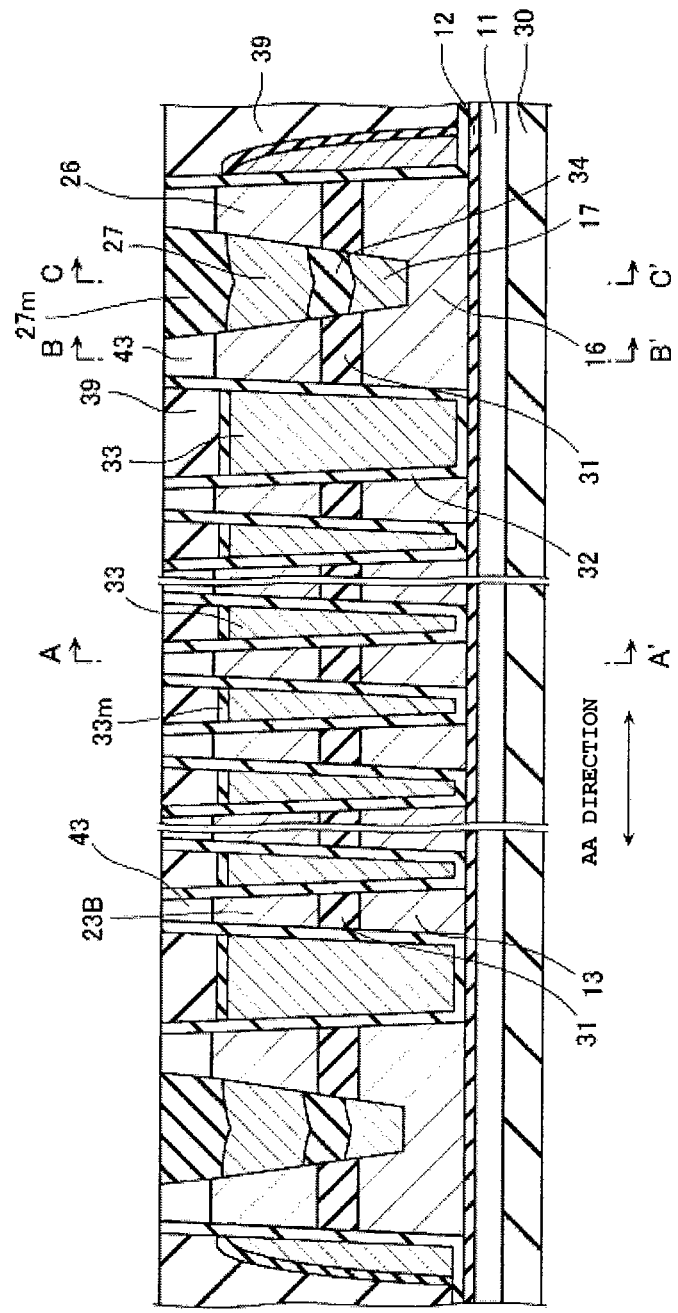
FIG. 15 is a cross-sectional diagram showing the memory cell array structure of FIG. 1 during manufacturing.
Figure 16A:
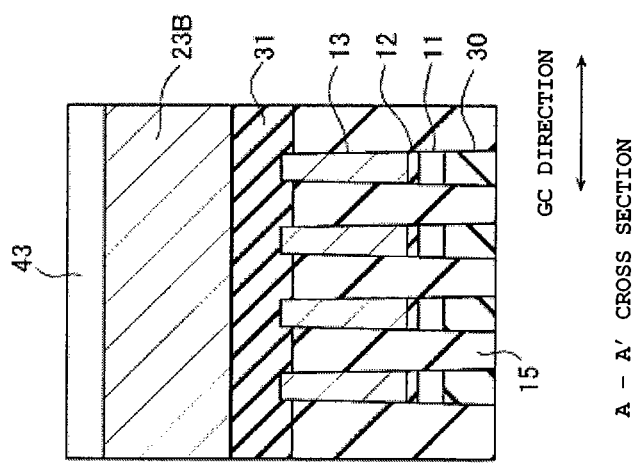
Figure 16B:
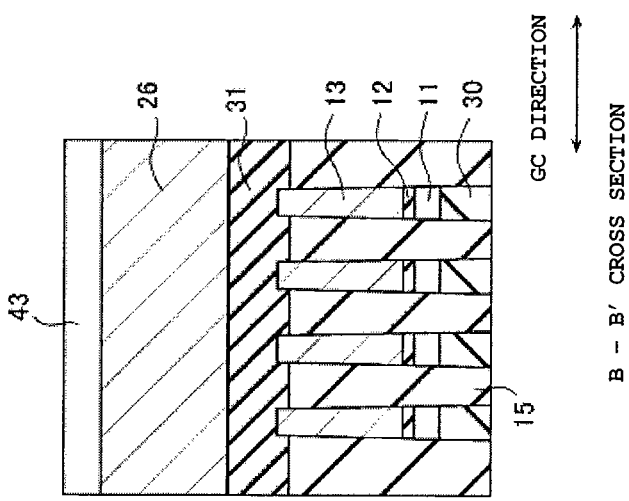

Next, as shown in FIG. 15, in order to form the independent selection gate transistors S11 to S22 of the upper layer cell and the lower layer cell, the selection gate 17A, the first selection gate line 17, the second insulation layer 34 and the second selection gate line 27 are formed in sequence while the steps of filling and etch-back are being repeated. As the selection gate lines 17, 27, in the same manner as the control gate 33, polysilicon or a metal (W or the like) can be used. In the portion etched back on top of the second selection gate line 27, a cap insulation layer 27m (referred to above as a mask material) is buried in, and its top side is flattened by CMP with the mask material 43 as the stopper. FIG. 16A, FIG. 16B, and FIG. 16C respectively represent the A-A' cross section, the B-B' cross section, and the C-C' cross section of the structure shown in FIG. 15.

Figure 17:
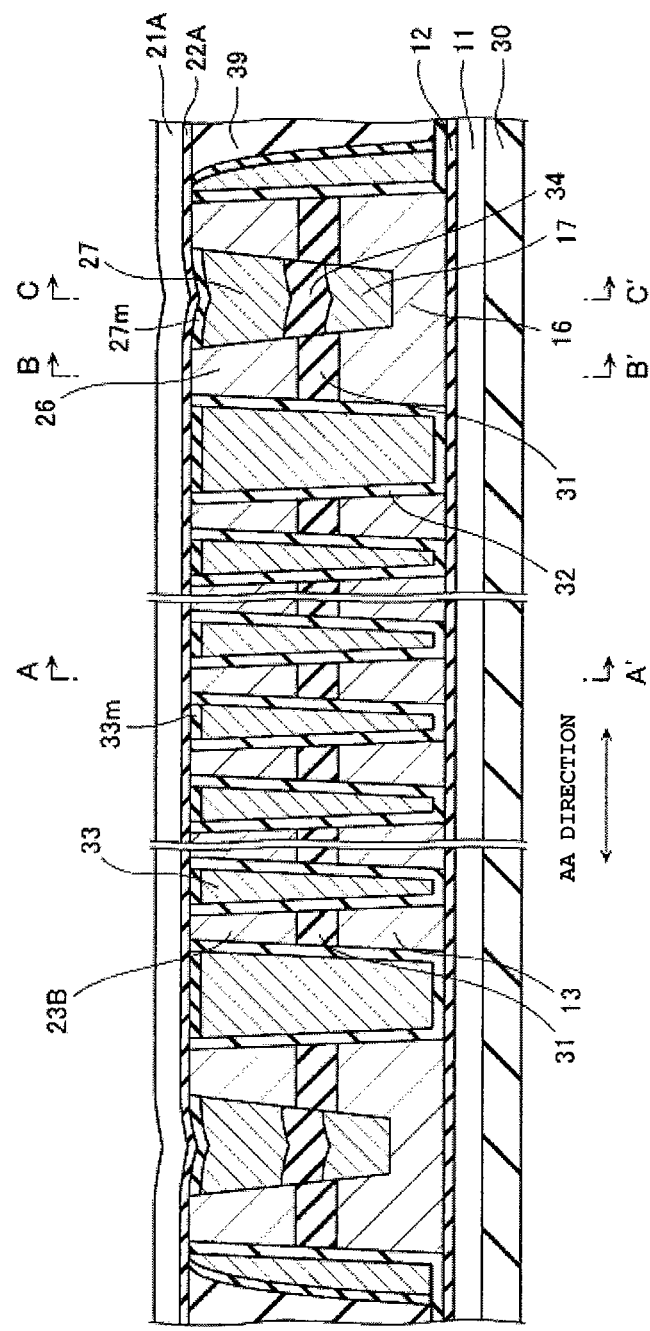
FIG. 17 is a cross-sectional diagram showing the memory cell array structure of FIG. 1 during manufacturing.
Figure 18A:
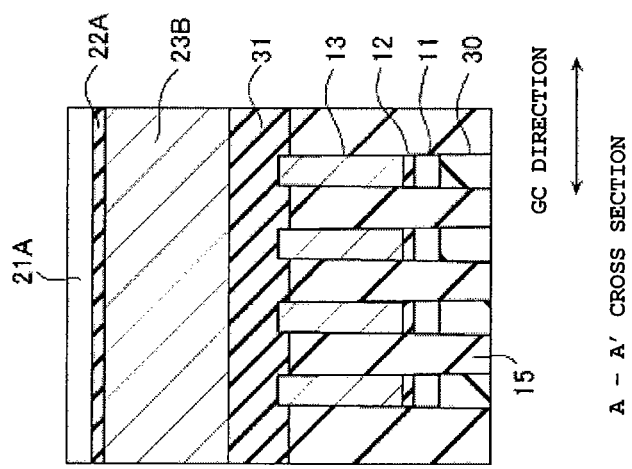
Figure 18C:
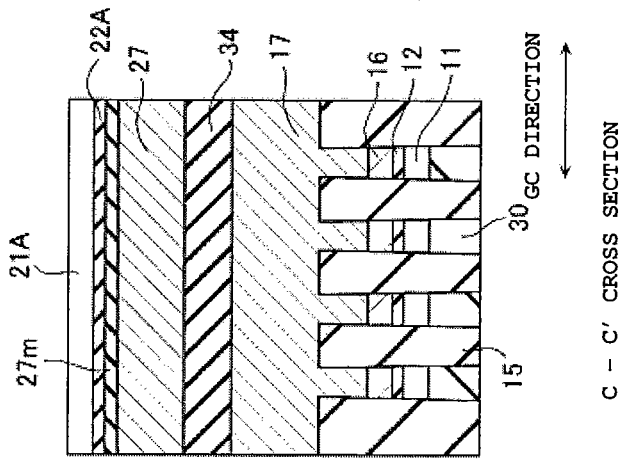
Figure 19:
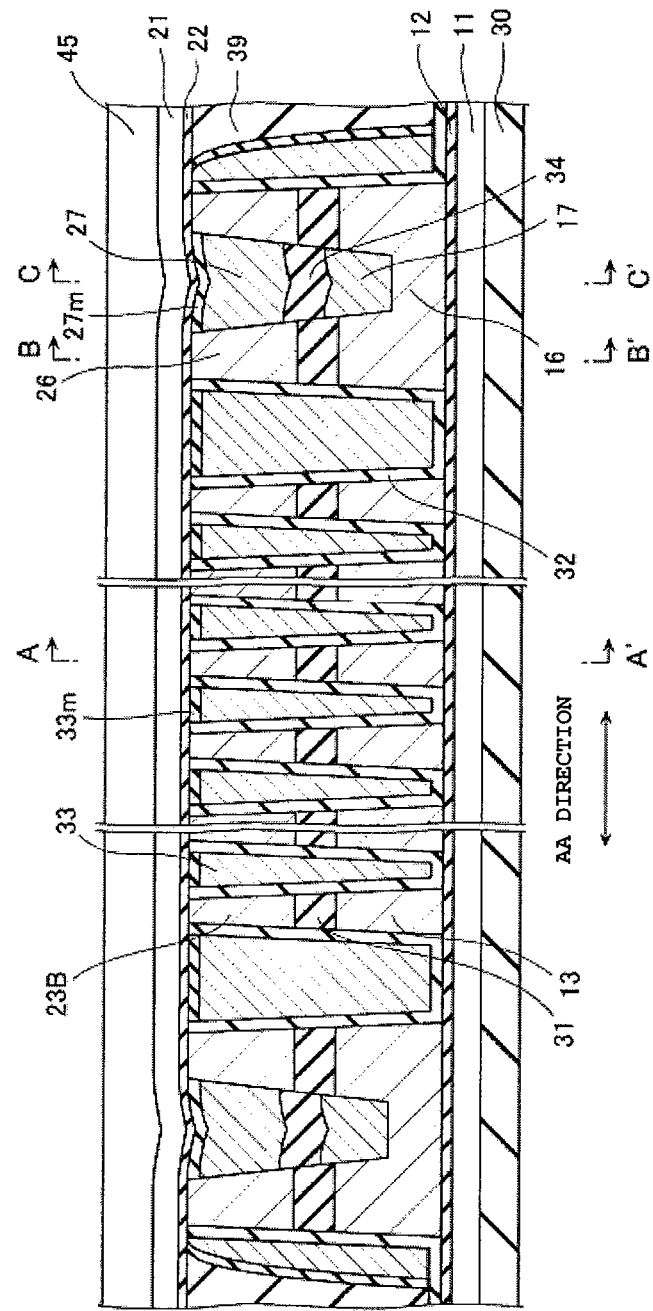
FIG. 19 is a cross-sectional diagram showing the memory cell array structure of FIG. 1 during manufacturing.
Figure 20B:
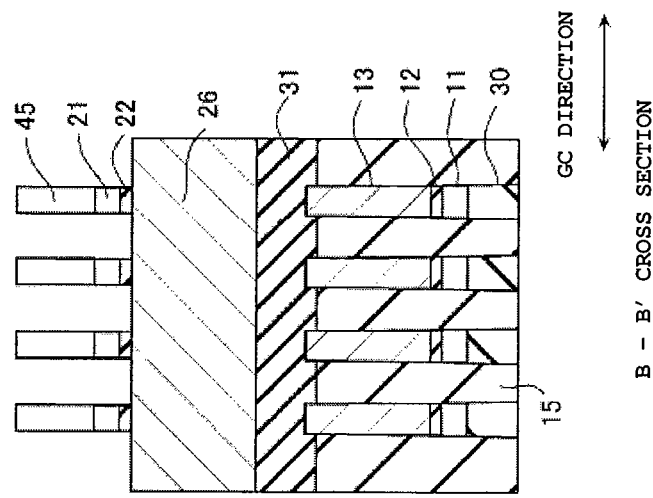
Figure 21:
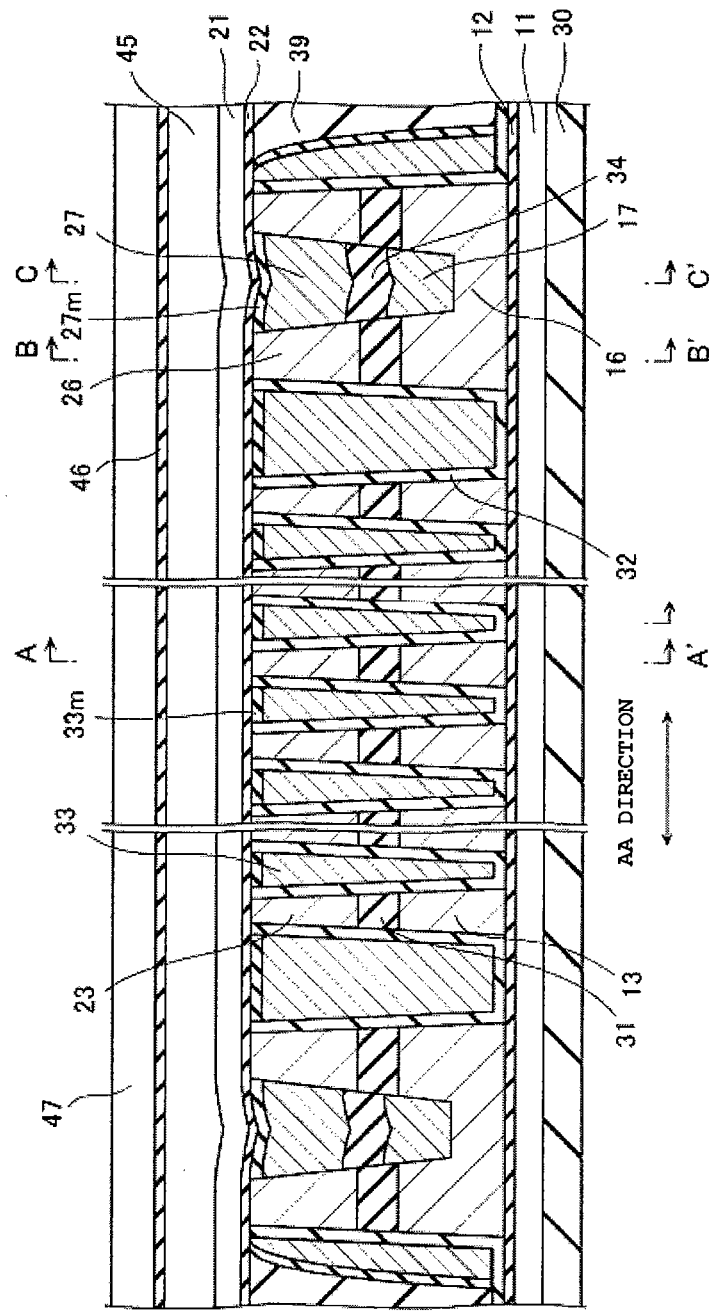
FIG. 21 is a cross-sectional diagram showing the memory cell array structure of FIG. 1 during manufacturing.
Figure 22A:
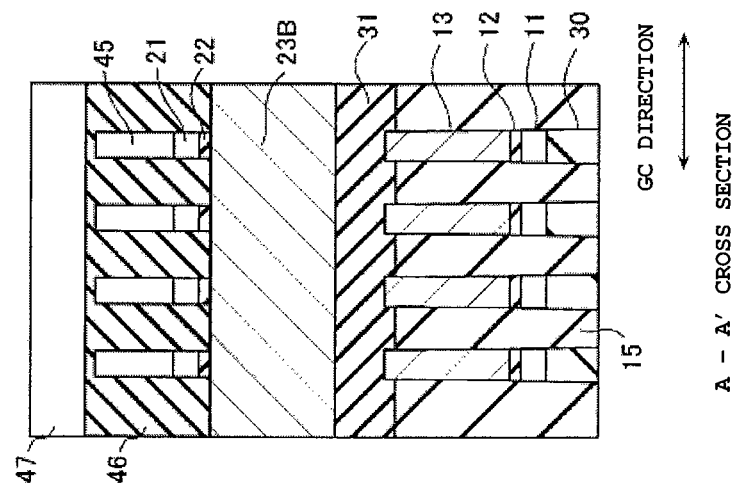
Figure 22B:
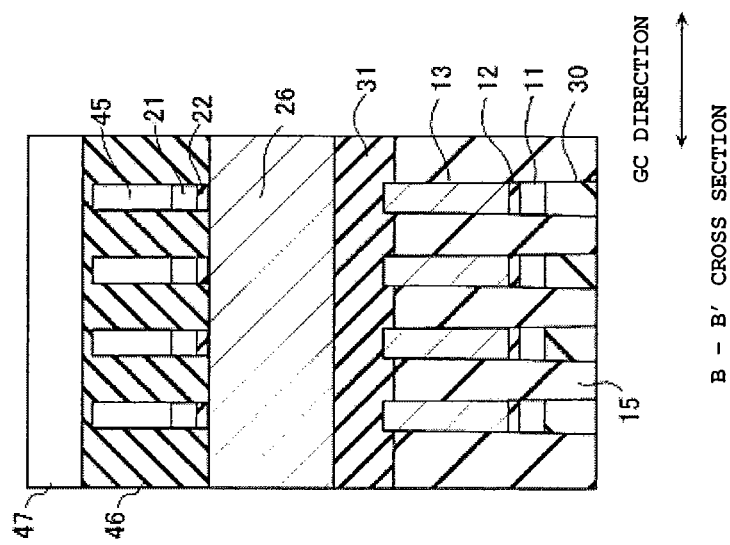

Next, as shown in FIG. 17, flattening is carried out by CMP with the second gate 26 as the stopper. On top of it, a second gate insulation layer 22A of SiO2 and a second semiconductor layer 21A of polysilicon are formed as films in sequence. Alternatively, CMP may be carried out with the control gate 33 as the stopper. FIG. 18A, FIG. 18B, and FIG. 18C respectively represent the A-A' cross section, the B-B' cross section, and the C-C' cross section of the structure shown in FIG. 17.

Continuing, on the second memory cell array layer, the AA pattern is formed. As shown in FIG. 19 and FIGS. 20A to 20C, in order to carry out the AA pattern processing on the top layer of a second semiconductor layer 21A, the second gate insulation layer 22A and the second gate formation layer 23B, a mask material 45 of SiN is subjected to the pattern formation. With respect to the second semiconductor layer 21A and the second gate insulation layer 22A, the AA pattern processing is carried out using RIE. The second semiconductor layer 21 and the second gate insulation layer 22 are thereby formed.

Now, the second gate formation layer 23B needs to be etched with the mask material 45 as the mask until the first insulation layer 31 is reached to form the second floating gate 23 separated in the GC direction. However, in the case such etching is continued, the second selection gate line 27 will be etched at the same time. The selection gate line 27 is formed in a concave/convex form and has a high resistance or, in the worst case, separation of the insulation in the GC direction is possible. Accordingly, in the present embodiment, prior to etching the second gate formation layer 23B, the portions for the formation of the second selection gates (S12), (S22) are protected.

Figure 23:
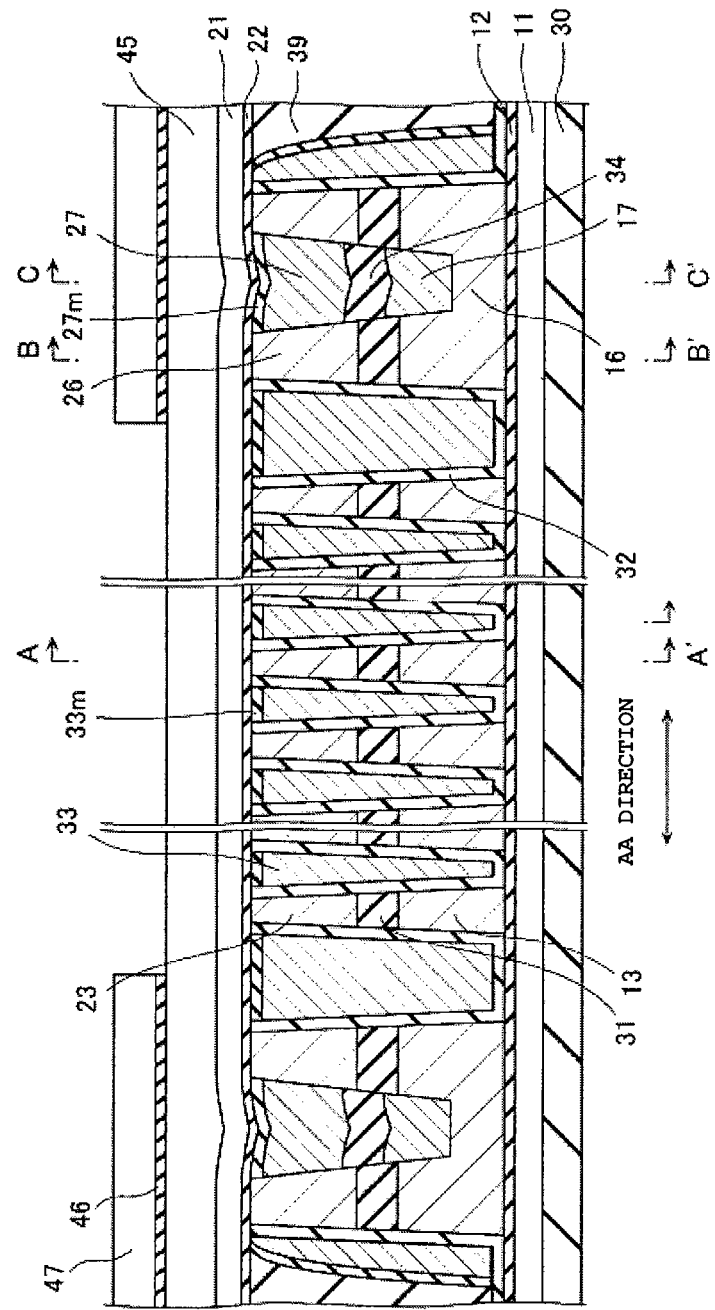
FIG. 23 is a cross-sectional diagram showing the memory cell array structure of FIG. 1 during manufacturing.
Figure 24A:
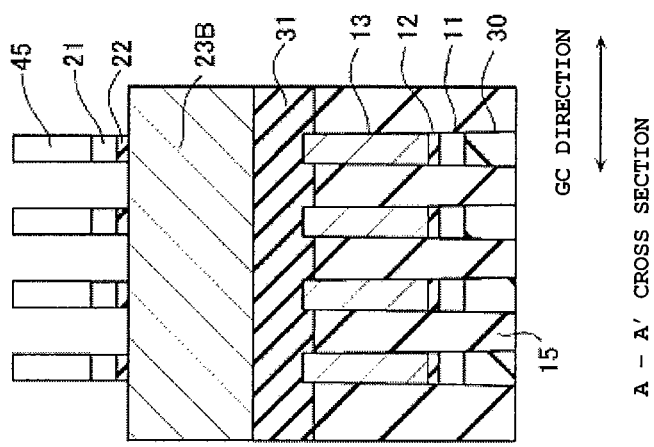
FIGS. 24A to 24C are cross-sectional diagrams showing the memory cell array structure of FIG. 1 during manufacturing.
Figure 24B:
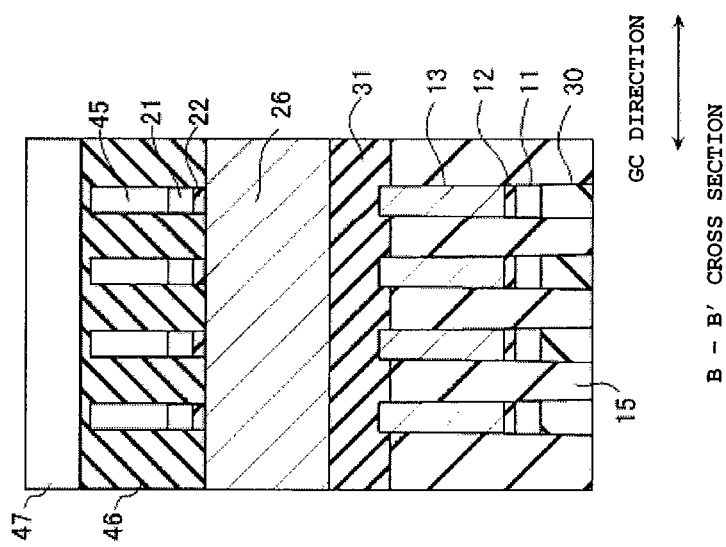
Figure 24C:
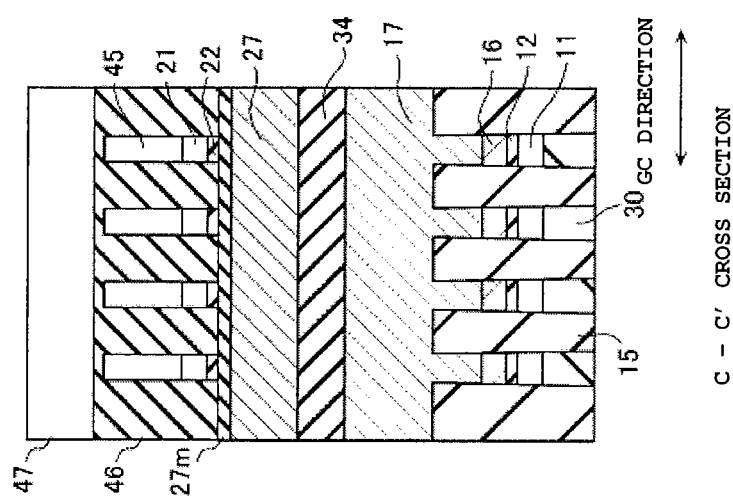

In other words, on the top side of the pattern formed in the manner shown in FIG. 21 and FIGS. 22A to 22C, an organic film 46 is coated on the top of the mask material 45. After flattening the top portion, a selection gate protection resist 47 is coated on the top. Next, the organic film 46 of the portion located on the top portion of the selection gate 26 and the selection gate protection resist 47 are left remaining in the manner shown in FIG. 23 and FIGS. 24A to 24C; the others are removed. As shown in FIG. 23, the boundary of the organic film 46 and the selection gate protection resist 47 is located on the top portion of the control gate 33 between the selection gates (S12), (S22) and the memory cell MC adjacent to the selection gates (S12), (S22). However, the organic film 46 and the selection gate protection resist 47 does not cover at least the top portion of the second floating gate 23 of the memory cell MC. It should be understood that, as long as it is the location at which the top portion of the second selection gate line 27 is completely covered with the resist, the boundary location may be selected at will.

Figure 25A:
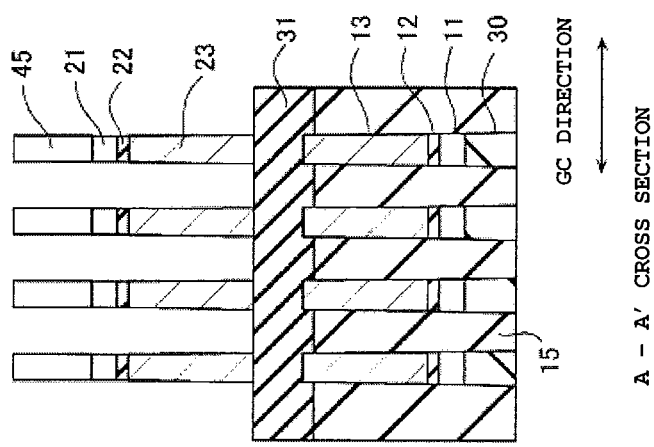
Figure 25B:
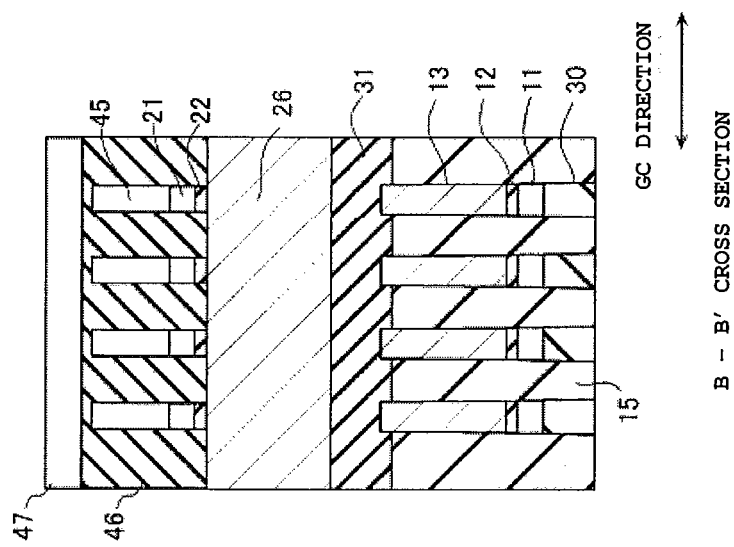
Figure 26:
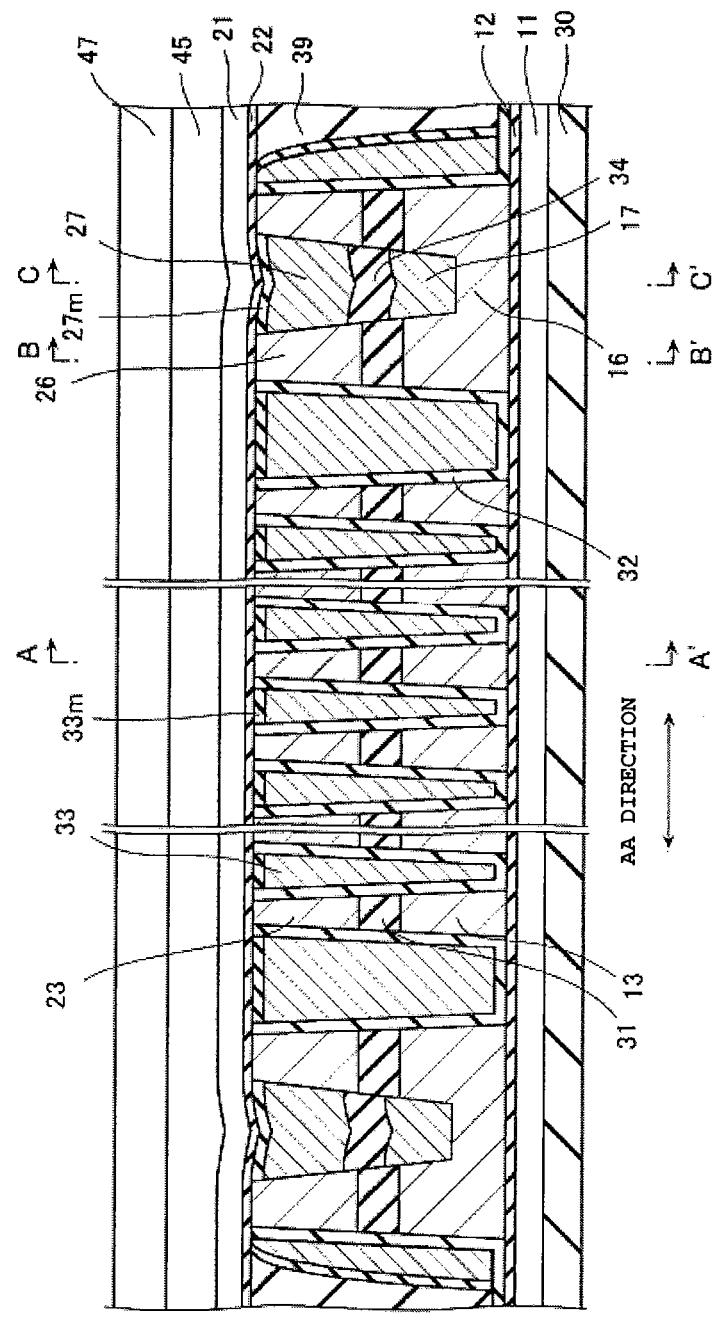
FIG. 26 is a cross-sectional diagram showing the memory cell array structure of a nonvolatile semiconductor memory device that is manufactured according a different process.
Figure 27A:
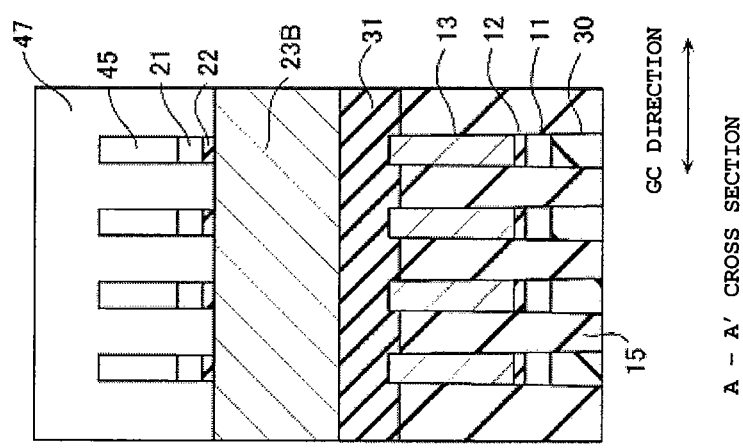
FIGS. 27A to 27C are cross-sectional diagrams showing the memory cell array structure of FIG. 26 during manufacturing.
Figure 27B:
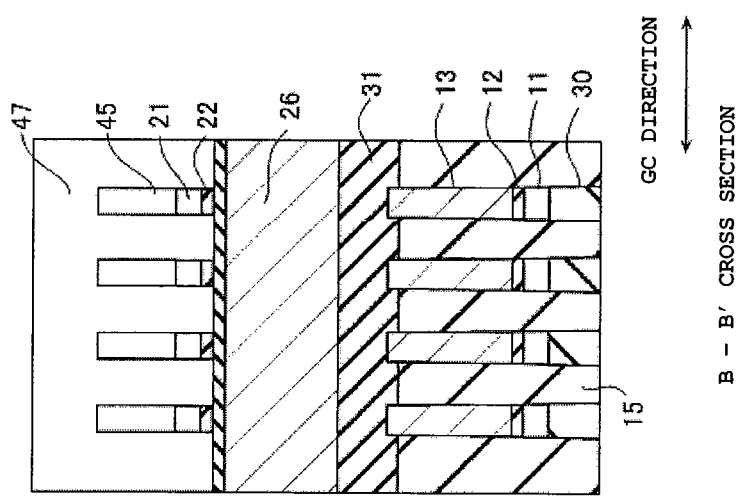
Figure 27C:
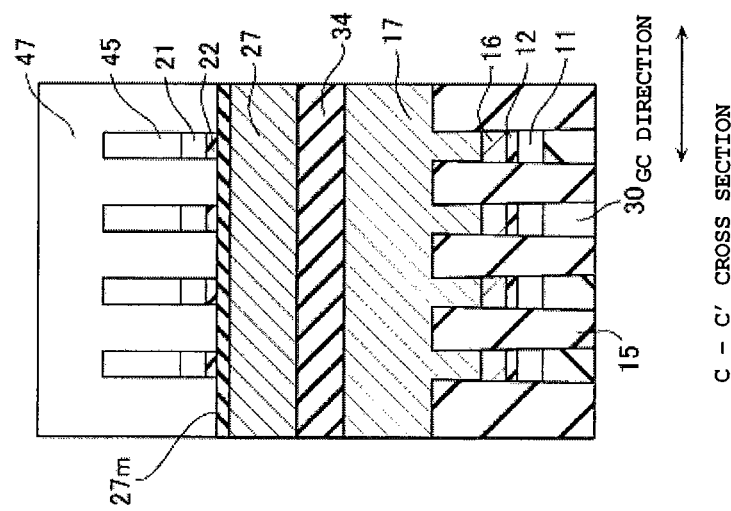

Next, as shown in FIGS. 25A to 25C, by using the mask material 45, the AA pattern processing is carried out with RIE on the second gate formation layer 23B, and the second floating gate 23 is formed thereby.

In the case of forming the AA pattern of the second memory cell array layer using the method described above, since the second selection gate line 27 is not sectioned in the GC direction, uniform formation is possible because high resistance or insulation of the second selection gate line 27 are prevented.

Finally, by removing the organic film 46, the selection gate protection resist 47, and the mask material 45, filling in the second element separation insulation layer 25 (FIG. 1, FIGS. 3A to 3C) in the upper layer AA pattern groove, and forming the contacts 35 to 38, the structure shown in FIG. 1 to FIGS. 3A to 3C is formed.

Embodiment 2

Next, an explanation will be given in regard to the second embodiment. The nonvolatile semiconductor device according to the second embodiment is basically the same as that in the first embodiment, but a portion of the manufacturing process is different. In other words, in the present embodiment, in order to protect the second selection gate line 27, the organic film 46 is not used, and the selection gate protection resist 47 is directly coated. By such a method, in comparison to the first embodiment, it is possible to shorten the manufacturing process.

Figure 28:
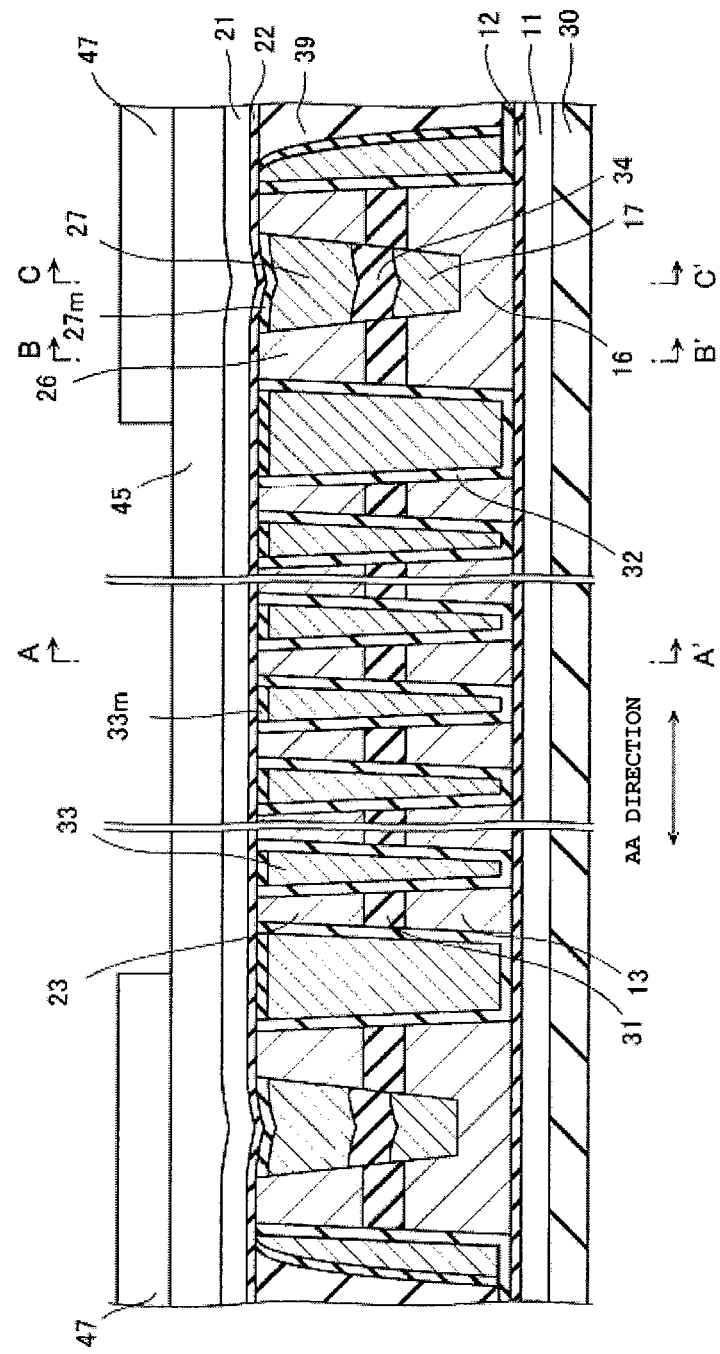
FIG. 28 is a cross-sectional diagram showing the memory cell array structure of FIG. 26 during manufacturing.
Figure 29A:
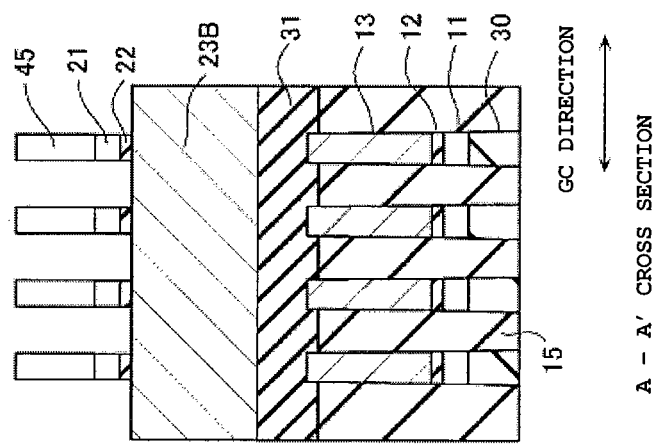
FIGS. 29A to 29C are cross-sectional diagrams showing the memory cell array structure of FIG. 26 during manufacturing.
Figure 29B:
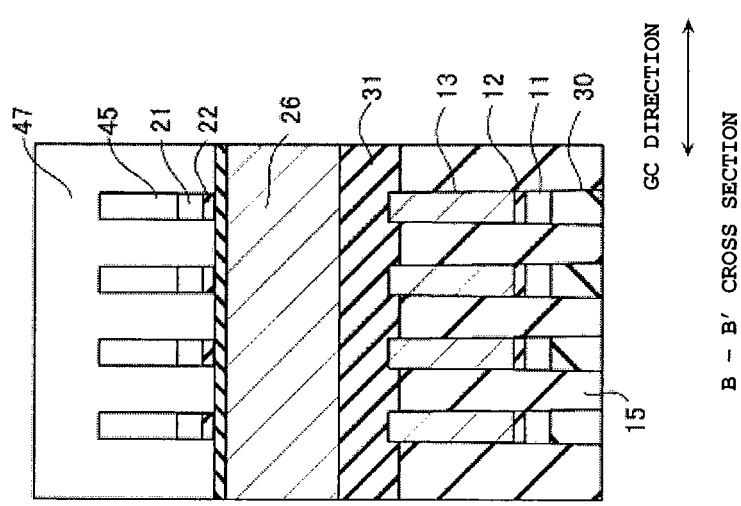
Figure 29C:
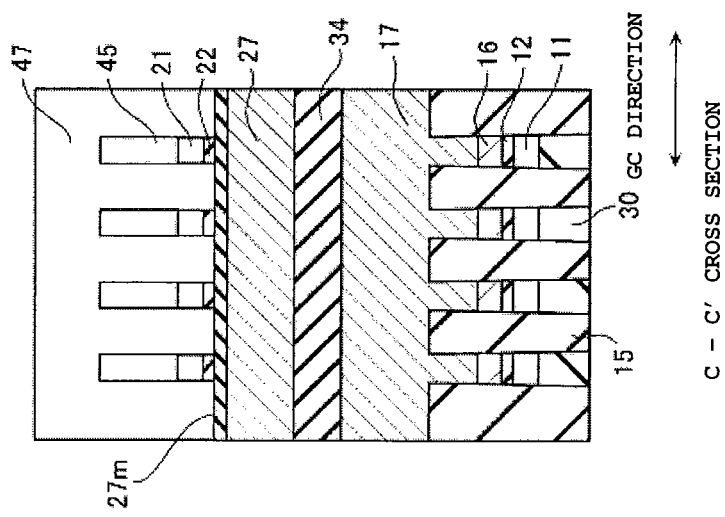

The method for the manufacture of the nonvolatile semiconductor memory device according to the second embodiment is the same as that in the first embodiment up to the processes shown in FIG. 19 and FIGS. 20A to 20C. Next, with respect to the pattern top side formed in the manner shown in FIG. 26 and FIGS. 27A to 27C, the selection gate protection resist 47 is coated from the top of the mask material 45. By leaving behind only the selection gate protection resist 47 in the portion located in the top portion of the selection gate 26 as shown in FIG. 28 and FIGS. 29A to 29C, the others can be removed. The boundary of the selection gate protection resist 47 in the portion located on the top portion of the control gate 33 between the selection gates (S12), (S22) and the memory cell MC adjacent to the selection gates (S12), (S22) in FIG. 28 is located. However, for the selection gate protection resist 47, at least the top portion of the second floating gate 23 of the memory cell MC is not covered. Furthermore, as long as the location of the top portion of the second selection gate line 27 is completely covered, the boundary location may be selected at will.

Figure 30A:
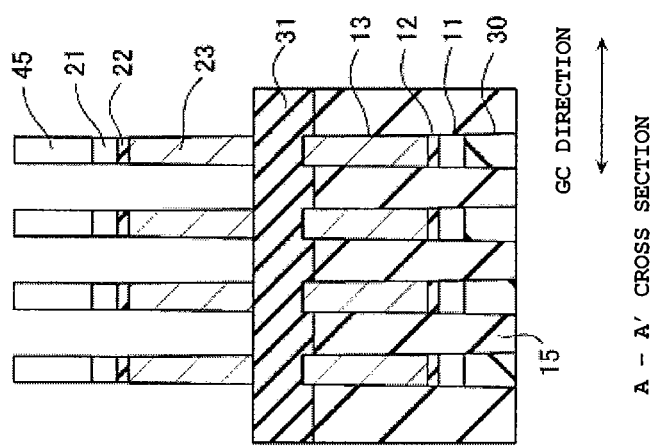
FIGS. 30A to 30C are cross-sectional diagrams showing the same memory cell array structure of FIG. 26 during manufacturing.
Figure 30B:
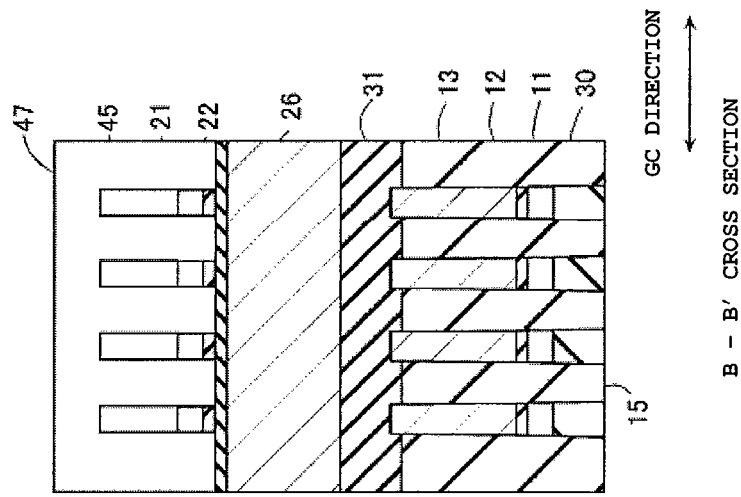
Figure 30C:
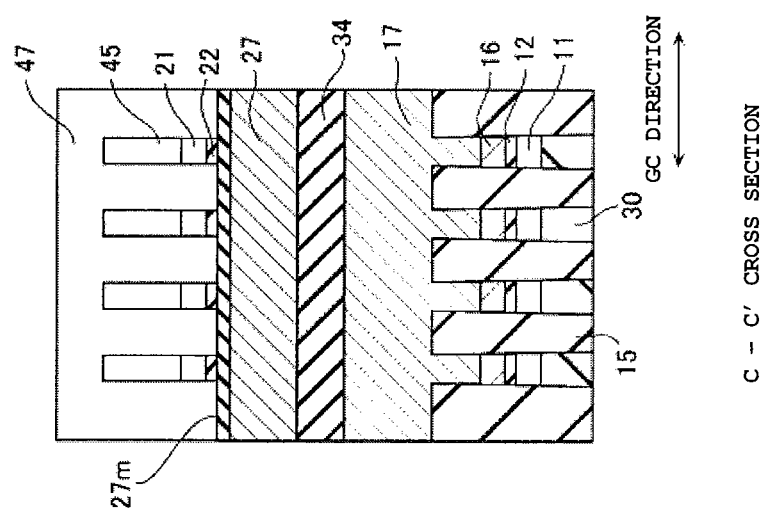

Next, as shown in FIGS. 30A to 30C, where the portion is not covered with the selection gate protection resist 47 on the pattern top side, the AA pattern processing is carried out on the second gate formation layer 23B by the RIE using the mask material 45, and the second floating gate 23 is formed.

Finally, in the same manner as in the first embodiment, by the removal of the selection gate protection resist 47 and the mask material 45, the filling of the second element separation insulation layer 25 (FIG. 1, FIGS. 3A to 3C) in the upper layer AA pattern groove, and the formation of the contacts 35 to 38, the structure shown in FIG. 1 to FIGS. 3A to 3C is formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   an upper structure including a plurality of memory cells arranged in rows extending in a first direction and columns extending in a second direction; and
   a lower structure including a plurality of memory cells arranged in rows and columns,
   wherein each of the memory cells includes a charge accumulation layer formed in one of the upper structure and the lower structure, and a pair of control gate electrodes extending in the second direction that are formed on either side of the charge accumulation layer of the memory cell and across both the upper structure and the lower structure,
   the upper structure including a first selection gate transistor and a second selection gate transistor in each row, wherein the first selection gate transistor includes a first selection gate partially surrounding a first selection gate line and the second selection gate transistor includes a second selection gate partially surrounding a second selection gate line, wherein the first selection gate and the second selection gate each extend as one body from a first row to one or more other rows,
   the lower structure including a third selection gate transistor and a fourth selection gate transistor in each row,
   each of the memory cells in each row in the upper structure are between the first and second selection gate transistors of that same row, and each of the memory cells in each row in the lower structure are between the third and fourth selection gate transistors of that same row.

2. The nonvolatile semiconductor memory device of claim 1, wherein the charge accumulation layer for each of the memory cells is formed in one of the upper structure and the lower structure but not in the other one of the upper structure and the lower structure.

3. The nonvolatile semiconductor memory device of claim 1, further comprising semiconductor layers for the memory cells that extend in the first direction.

4. The nonvolatile semiconductor memory device of claim 3, wherein the charge accumulation layers include an upper charge accumulation layer and a lower charge accumulation layer that are formed on either side of an insulating layer.

5. The nonvolatile semiconductor memory device of claim 4, wherein one of the memory cells in the upper structure includes the upper charge accumulation layer, a pair of control gate electrodes on either side of the upper charge accumulation layer, and one of the semiconductor layers.

6. The nonvolatile semiconductor memory device of claim 5, wherein one of the memory cells in the lower structure includes the lower charge accumulation layer, said pair of control gate electrodes, and said one of the semiconductor layers.

7. The nonvolatile semiconductor memory device of claim 3, wherein the semiconductor layers include upper semiconductor layers that extend in the first direction and lower semiconductor layers that extend in the first direction.

8. The nonvolatile semiconductor memory device of claim 7, wherein the memory cells in the upper structure each include one of the upper semiconductor layers and the memory cells in the lower structure each include one of the lower semiconductor layers.

9. The nonvolatile semiconductor memory device of claim 3, wherein the memory cells along the second direction are separated by element separation layers, wherein the first selection gate lines, and the second selection gate lines each extend continuously in the second direction from the first row to one or more of the other rows.

10. A nonvolatile semiconductor memory device, comprising:
a first memory cell structure having a first NAND cell unit and one or more other NAND cell units, the first NAND cell unit provided with multiple first memory cells connected in series along a first direction and a first selection gate transistor connected on both ends of the multiple first memory cells, the first memory cells and the first selection gate transistor including a first semiconductor layer, a first gate insulation film formed on top of the first semiconductor layer, and a first gate layer formed on top of the first gate insulation film, the first gate layer including a first floating gate in the first memory cells and a first selection gate in the first selection gate transistor;
a first insulation layer formed on top of the first memory cell structure;
a second memory cell structure formed on the first insulation layer, and having a second NAND cell unit and one or more other second NAND cell units, the second NAND cell unit provided with multiple second memory cells connected in series along the first direction and a second selection gate transistor connected on both ends of the multiple second memory cells, the second memory cells and the second selection gate transistor including a second gate layer formed on top of the first insulation layer, a second gate insulation film formed on top of the second gate layer, and a second semiconductor layer formed on top of the second gate insulation film, wherein the second gate layer includes a second floating gate in the first memory cells and a second selection gate in the second selection gate transistor;
a control gate formed on both sides of the first and second floating gates and extending in a second direction perpendicular to the first direction; and
a first selection gate line and a second selection gate line connected respectively to the first and second selection gates and extending in the second direction, wherein the second selection gate extends as one body from the second NAND cell unit to the one or more other second NAND cell units.

11. The nonvolatile semiconductor memory device of claim 10, wherein the first and second semiconductor layers extend in the first direction.

12. The nonvolatile semiconductor memory device of claim 10, wherein the memory cells along the second direction are separated by element separation layers.

13. A nonvolatile semiconductor memory device, comprising:
a first memory cell structure having a first NAND cell unit and one or more other NAND cell units, the first NAND cell unit provided with multiple first memory cells connected in series along a first direction and a first selection gate transistor connected on both ends of the multiple first memory cells, the first memory cells and the first selection gate transistor including a first semiconductor layer, a first gate insulation film formed on top of the first semiconductor layer, and a first gate layer formed on top of the first gate insulation film, the first gate layer including a first floating gate in the first memory cells and a first selection gate in the first selection gate transistor;
a first insulation layer formed on top of the first memory cell structure;
a second memory cell structure formed on the first insulation layer, and having a second NAND cell unit and one or more other second NAND cell units, the second NAND cell unit provided with multiple second memory cells connected in series along the first direction and a second selection gate transistor connected on both ends of the multiple second memory cells, the second memory cells and the second selection gate transistor including a second gate layer formed on top of the first insulation layer, a second gate insulation film formed on top of the second gate layer, and a second semiconductor layer formed on top of the second gate insulation film, wherein the second gate layer includes a second floating gate in the first memory cells and a second selection gate in the second selection gate transistor, wherein the second selection gate extends as one body from the second NAND cell unit to the one or more other second NAND cell units; and
a control gate formed on both sides of the first and second floating gates and extending in a second direction perpendicular to the first direction.

14. The nonvolatile semiconductor memory device of claim 13, further comprising a first selection gate line and a second selection gate line connected respectively to the first and second selection gates and extending in the second direction, wherein the second selection gate and the second selection line extend continuously in the second direction from the second NAND cell unit to the one or more other second NAND cell units.

15. The nonvolatile semiconductor memory device of claim 13, wherein the first selection gate of the each first NAND cell unit is a separate body from the first selection gates of the other first NAND cell units.

* * * * *